(12) United States Patent
McCraith et al.

(10) Patent No.: US 7,876,167 B1
(45) Date of Patent: Jan. 25, 2011

(54) HYBRID SYSTEM HAVING A NON-MEMS DEVICE AND A MEMS DEVICE

(75) Inventors: Andrew D. McCraith, Orinda, CA (US); Richard S. Miller, Los Altos, CA (US); Emmanuel P. Quevy, El Cerrito, CA (US)

(73) Assignee: Silicon Laboratories Inc., Austin, TX (US)

( * ) Notice: Subject to any disclaimer, the term of this patent is extended or adjusted under 35 U.S.C. 154(b) by 29 days.

(21) Appl. No.: 12/028,503

(22) Filed: Feb. 8, 2008

Related U.S. Application Data

(60) Provisional application No. 61/018,244, filed on Dec. 31, 2007.

(51) Int. Cl.
*H03B 5/32* (2006.01)
*H03B 5/40* (2006.01)

(52) U.S. Cl. .................. 331/116 M; 331/154; 331/158
(58) Field of Classification Search .................. 331/65, 331/154, 156, 158, 116 M
See application file for complete search history.

(56) References Cited

U.S. PATENT DOCUMENTS

| 7,106,143 | B2 | 9/2006 | Bloch et al. |
| 7,211,926 | B2 | 5/2007 | Quevy et al. |

*Primary Examiner*—Robert Pascal
*Assistant Examiner*—James E Goodley
(74) *Attorney, Agent, or Firm*—O'Keefe, Egan, Peterman & Enders LLP

(57) ABSTRACT

A hybrid system having a non-MEMS device and a MEMS device is described. The apparatus includes a non-MEMS device and an integrated circuit including a MEMS device, the integrated circuit formed on a substrate. The integrated circuit includes a control circuit for the non-MEMS device and a MEMS control circuit for the MEMS device.

48 Claims, 17 Drawing Sheets

HYBRID SYSTEM HAVING A NON-MEMS DEVICE AND A MEMS DEVICE

CROSS REFERENCE TO RELATED APPLICATIONS

This application claims the benefit of U.S. Provisional Application No. 61/018,244, filed Dec. 31, 2007, the entire contents of which are hereby incorporated by reference herein.

BACKGROUND OF THE INVENTION

1) Field of the Invention

The invention is in the field of Microelectromechanical Systems (MEMS).

2) Description of Related Art

A crystal oscillator is an electronic circuit that uses the mechanical resonance of a vibrating crystal of piezoelectric material to create an electrical signal with a very precise frequency. Crystal oscillators, such as quartz oscillators, are commonly used to generate frequencies to keep track of time (as in quartz clocks) or to provide a stable clock signal for digital integrated circuits. Usually, a different crystal is required for each desired frequency. Also, the crystal and the oscillator circuit components are typically distinct from one another, i.e. they are not integrated.

For the past several years, MEMS structures have been playing an increasingly important role in consumer products. For example, MEMS devices, such as sensors, detectors and mirrors, can be found in products ranging from air-bag triggers in vehicles to displays in the visual arts industry. In another example, high quality MEMS oscillators may be used in place of crystal oscillators to keep track of time and to provide a stable clock signal for digital integrated circuits. As these technologies mature, the demands on precision and functionality of the MEMS structures have escalated. For example, optimal performance may depend on the ability to fine-tune the characteristics of various components of these MEMS structures. Furthermore, consistency requirements for the performance of MEMS devices (both intra-device and device-to-device) often dictate that the processes used to fabricate such MEMS devices need to be extremely sophisticated.

Certain applications may require the generation of multiple frequencies. Crystal oscillators exhibit low phase noise and high precision, but a separate crystal is required for each desired frequency. This approach may not be compatible with highly compact spatial requirements often associated with current electronics applications. Space constraints may be addressed by using MEMS oscillators which may be fabricated on the same substrate as the corresponding MEMS oscillator circuits, i.e. as part of an integrated circuit, with multiple oscillators fitting on a single substrate. However, the quality of the frequency generated by a MEMS oscillator may not be as high as that of a crystal oscillator.

Thus, a hybrid system having a non-MEMS device and a MEMS device is described herein.

DETAILED DESCRIPTION

A hybrid system having a non-MEMS device and a MEMS device is described. In the following description, numerous specific details are set forth, such as material compositions and chemical regimes, in order to provide a thorough understanding of the present invention. It will be apparent to one skilled in the art that the present invention may be practiced without these specific details. In other instances, well-known features, such as lithographic parameters and patterning procedures, are not described in detail in order to not unnecessarily obscure the present invention. Furthermore, it is to be understood that the various embodiments shown in the Figures are illustrative representations and are not necessarily drawn to scale.

Disclosed herein is a hybrid system having a MEMS device and a non-MEMS device, such as a crystal. In accordance with an embodiment of the present invention, an apparatus includes a non-MEMS device and an integrated circuit including a MEMS device. The integrated circuit may be formed on a substrate. In one embodiment, the integrated circuit includes a control circuit for the non-MEMS device and a MEMS control circuit for the MEMS device.

A hybrid system may take advantage of the benefits of both a non-MEMS device and a MEMS device. For example, in accordance with an embodiment of the present invention, an apparatus includes a crystal oscillator and a MEMS device. The crystal oscillator is provided for generating a single frequency output having low phase noise and high precision, while the MEMS device is provided for generating a second frequency output and is compact to reduce space constraints. The crystal oscillator may be housed in the same package as the MEMS device. In one embodiment, the crystal oscillator provides a first frequency output and the MEMS device is a MEMS oscillator included for providing a second frequency output. Thus, the function (e.g. oscillation) of the non-MEMS device and the MEMS device may be the same. In another embodiment, the MEMS device is a temperature sensor and is included for providing a temperature output to compensate a crystal oscillator output in response to an environmental temperature change or fluctuation. Thus, the function (e.g. oscillation versus temperature sensing, respectively) of the non-MEMS device and the MEMS device may be different. In a specific embodiment, a crystal oscillator is packaged with both a MEMS oscillator and a MEMS temperature sensor. In another aspect, a crystal control circuit, a MEMS device, and a MEMS control circuit may all be fabricated on a single substrate to form an integrated circuit for a hybrid system. Thus, in accordance with an embodiment of the present invention, a single integrated circuit includes the circuitry for both a non-MEMS device and a MEMS device.

Figure 1A:
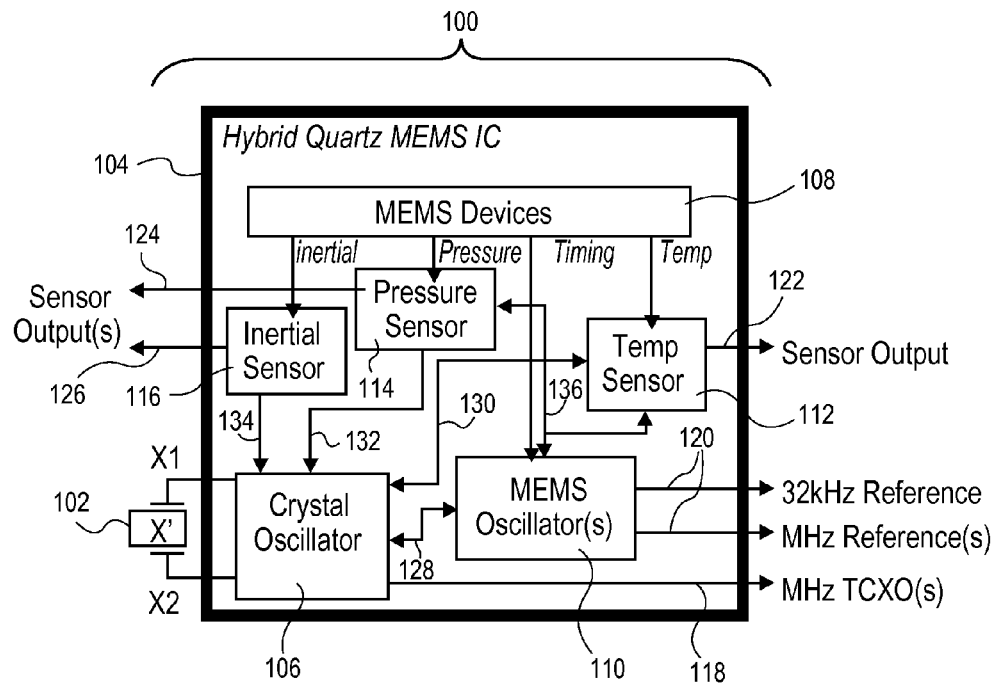
FIG. 1A illustrates a layout for an apparatus having a crystal oscillator and a MEMS device, in accordance with an embodiment of the present invention.

A hybrid system may include a crystal and an integrated circuit, wherein the integrated circuit includes a crystal control circuit, a MEMS device, and a MEMS control circuit for the MEMS device. FIG. 1A illustrates a layout for an apparatus having a crystal oscillator and a MEMS device, in accordance with an embodiment of the present invention.

Referring to FIG. 1A, a hybrid system 100 includes a crystal 102 and an integrated circuit 104. In accordance with an embodiment of the present invention, integrated circuit 104 is disposed on a substrate. Integrated circuit 104 includes a crystal control circuit 106 for crystal 102, a MEMS device 108, and a MEMS control circuit for MEMS device 108. In one embodiment, MEMS control circuit is a circuit such as, but not limited to, a MEMS oscillator circuit 110, a MEMS temperature sensor circuit 112, a MEMS pressure sensor circuit 114 or a MEMS inertial sensor circuit 116, all of which are depicted in FIG. 1A. Thus, in accordance with an embodiment of the present invention, a hybrid system having a non-MEMS device and a MEMS device includes a crystal and an integrated circuit, wherein the integrated circuit includes a crystal control circuit, a MEMS device, and a MEMS control circuit for the MEMS device.

A crystal oscillator, which includes crystal 102 coupled with crystal control circuit 106 formed in integrated circuit 104, may be provided for generating a crystal oscillation output 118. In one embodiment, crystal oscillation output 118 is an output having a frequency of greater than approximately 1 MHz, as depicted in FIG. 1A. In another embodiment, crystal oscillation output 118 is an output having a frequency of approximately 32 kHz.

The crystal oscillator may be included with any MEMS device and MEMS control circuit to form hybrid system 100. In accordance with an embodiment of the present invention, the MEMS device is a MEMS resonator and is coupled to a MEMS frequency circuit. In one embodiment the MEMS resonator is a MEMS oscillator and the MEMS frequency circuit is a MEMS oscillation circuit. In a specific embodiment, MEMS oscillator circuit 110 (which is coupled with a MEMS device 108) is provided for generating a MEMS oscillation output 120, as depicted in FIG. 1A. In an embodiment, MEMS oscillation output 120 is an output having a frequency of greater than approximately 1 MHz. In another embodiment, MEMS oscillation output 120 is an output having a frequency of approximately 32 kHz. More than one MEMS device or type of MEMS device may be included with the crystal oscillator to form hybrid system 100. For example, in a specific embodiment, integrated circuit 104 includes at least two MEMS oscillator circuits, each coupled with separate MEMS devices 108, wherein a first MEMS oscillation output is an output having a frequency of greater than approximately 1 MHz while a second MEMS oscillation output is an output having a frequency of approximately 32 kHz, as depicted in FIG. 1A.

In accordance with another embodiment of the present invention, the MEMS device is a device such as, but not limited to a MEMS temperature sensor, a MEMS inertial sensor, a MEMS pressure sensor or a MEMS switch. In one embodiment, the MEMS device is a MEMS inertial sensor such as, but not limited to, a MEMS accelerometer or a MEMS gyroscope. In accordance with an embodiment of the present invention, the MEMS device is for detecting an environmental change. In one embodiment, MEMS temperature sensor circuit 112, which is coupled with a MEMS device 108, is provided for generating a temperature output 122. In a specific embodiment, integrated circuit 104 of hybrid system 100 includes both a MEMS temperature sensor circuit 112 for generating a temperature output 122 and a MEMS oscillator circuit 110 for generating an oscillation output 120. In another embodiment, MEMS pressure sensor circuit 114, which is coupled with a MEMS device 108, is provided for generating a pressure output 124. In another embodiment, MEMS inertial sensor circuit 116, which is coupled with a MEMS device 108, is provided for generating an inertial output 126.

Crystal control circuit 106 may be coupled to a MEMS control circuit. In accordance with an embodiment of the present invention, MEMS oscillator circuit 110 is coupled to crystal control circuit 106 by a coupler 128, as depicted in FIG. 1A, and is included for outputting an oscillation output into crystal control circuit 106. In another embodiment, MEMS temperature sensor circuit 112 is coupled to crystal control circuit 106 by a coupler 130, as depicted in FIG. 1A, and is included for outputting a temperature output into crystal control circuit 106. In a specific embodiment, MEMS temperature sensor circuit 112 is also coupled to MEMS pressure sensor circuit 114 and/or to MEMS oscillator circuit 110 by a coupler 136. In another embodiment, MEMS pressure sensor circuit 114 is coupled to crystal control circuit 106 by a coupler 132, as depicted in FIG. 1A, and is included for outputting a pressure output into crystal control circuit 106. In another embodiment, MEMS inertial sensor circuit 116 is coupled to crystal control circuit 106 by a coupler 134, as depicted in FIG. 1A, and is included for outputting an inertial output into crystal control circuit 106.

Alternatively, crystal oscillation circuit may be coupled to a MEMS control circuit for outputting a crystal oscillation output into the MEMS control circuit. In one embodiment, crystal control circuit 106 is coupled to MEMS oscillator circuit 110 by coupler 128, as depicted in FIG. 1A, and outputs an oscillation output into MEMS oscillator circuit 110. In another embodiment, crystal control circuit 106 is coupled to MEMS temperature sensor circuit 112 by coupler 130, as depicted in FIG. 1A, and outputs a temperature output into MEMS temperature circuit 112.

Crystal 102 and integrated circuit 104 may be contained in the same packaging arrangement. Thus, in accordance with an embodiment of the present invention, crystal 102 and integrated circuit 104 are housed together in a single package. In one embodiment, integrated circuit 104 includes a plurality of semiconductor devices. In one embodiment, crystal 102 is composed of a material such as, but not limited to, quartz or a ceramic material. In another embodiment, crystal 102 is a cavity resonator.

Figure 1B:
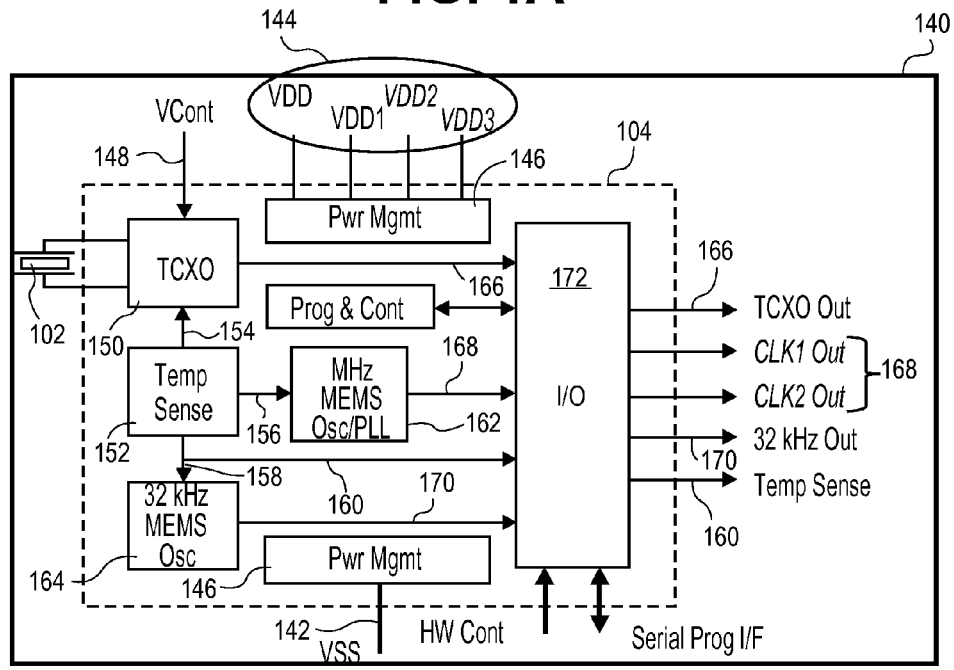
FIG. 1B illustrates a layout for an apparatus having a crystal oscillator and a MEMS device, in accordance with an embodiment of the present invention.

A hybrid system having a non-MEMS device and a MEMS device may be arranged to optimize the input of an associated power supply. FIG. 1B illustrates a layout for an apparatus having a crystal oscillator and a MEMS device, in accordance with an embodiment of the present invention.

Referring to FIG. 1B, a hybrid system 140 includes a crystal 102 and an integrated circuit 104. Integrated circuit 104 has a negative supply voltage 142 (VSS) and positive supply voltages 144 (VDD, VDD1, VDD2, and VDD3)

coupled with power management regions 146. A control voltage 148 (Vcont) is input to a temperature-compensated crystal oscillator 150 (TCXO), which includes crystal 102. In one embodiment, a MEMS temperature sensor 152 is included for outputting temperature outputs 154, 156, 158 and 160 to temperature-compensated crystal oscillator 150, to a high frequency MEMS oscillator 162, to a low frequency MEMS oscillator 164, or outside of integrated circuit 104, respectively, as depicted in FIG. 1B. Thus, in accordance with an embodiment of the present invention, hybrid system 140 can output a temperature-compensated crystal oscillator output 166 (TCXO Out), temperature-compensated high frequency MEMS oscillator outputs 168 (CLK1 Out and CLK2 Out), a temperature-compensated low frequency MEMS oscillator output 170 (32 kHz Out), temperature sensor output 160, or a combination thereof, via circuit 172 (I/O). A hardware control (HW cont), a serial programming interface (serial prog I/F), and a programming and control region (Prog & cont) may also be included, as depicted in FIG. 1B.

The integrated circuit portion of a hybrid system may include a MEMS device integrated with complimentary metal-oxide-silicon (CMOS) devices. In accordance with an embodiment of the present invention, the integrated circuit of a hybrid system includes a crystal control circuit, a MEMS device, and a MEMS control circuit for the MEMS device. In one embodiment, a plurality of CMOS devices is formed above an already fabricated MEMS device on a substrate. This arrangement may have its limitations, however, since many CMOS architectures require the use of virgin substrates for optimal performance. Thus, in accordance with another embodiment of the present invention and as described in detail below, a MEMS device is incorporated onto the same substrate as a plurality of CMOS devices by forming the MEMS device subsequent to forming the plurality of CMOS devices. In a specific embodiment, for optimal integration of the MEMS device with the plurality of CMOS devices, all process steps used to form the MEMS device are carried out at a temperature less than approximately 450° C.

Figure 2:
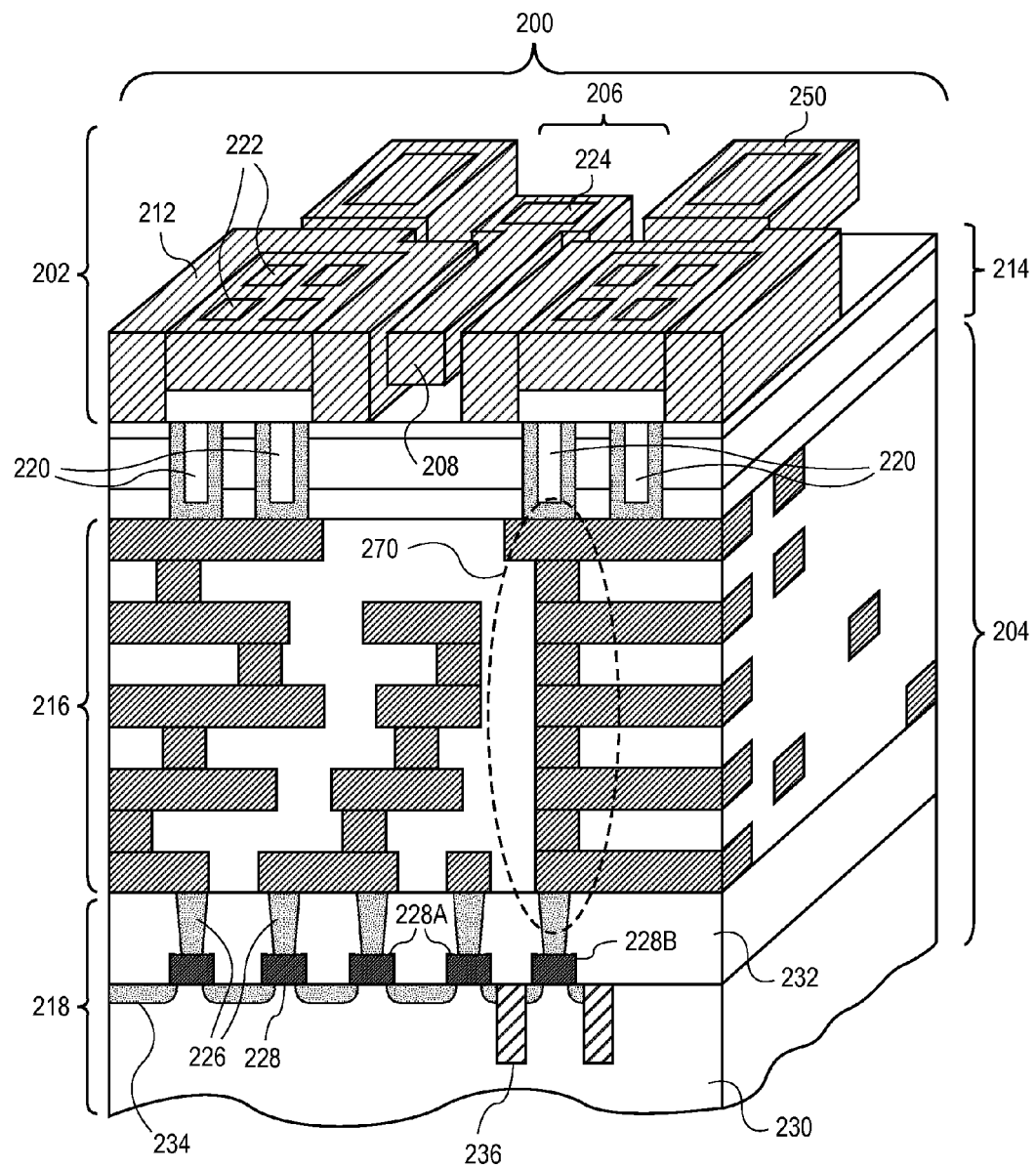
FIG. 2 illustrates a cross-sectional view representing an integrated circuit-compatible MEMS device, in accordance with an embodiment of the present invention.

In an aspect of the present invention, an integrated circuit may include a crystal control circuit, a MEMS device, and a MEMS control circuit for the MEMS device. FIG. 2 illustrates a cross-sectional view representing an integrated circuit-compatible MEMS device, in accordance with an embodiment of the present invention.

Referring to FIG. 2, a structure 200 includes a MEMS device 202 above a CMOS architecture 204. MEMS device 202 includes a member 206 having a suspended portion 208 in between a driver electrode 210 and a sensor electrode 212 and suspended above an isolation stack 214. CMOS architecture 204 includes a plurality of interconnects 216 above a plurality of CMOS devices 218. MEMS device 202 is coupled with the plurality of interconnects 216 via electrical contacts 220 and a first set of couplers 222 in driver electrode 210 and sensor electrode 212. Member 206 of MEMS device 202 is anchored to isolation stack 214 via a second set of couplers 224 (depicted as one coupler in FIG. 2). The plurality of interconnects 216 is coupled with the plurality of semiconductor devices 218 by device contacts 226, which are coupled with individual semiconductor devices 228 formed on a substrate 230. In accordance with an embodiment of the present invention, a crystal control circuit and a MEMS control circuit are formed in the plurality of CMOS devices 218.

Structure 200 may be any arrangement that couples a MEMS device with an CMOS architecture. MEMS device 202 may be any device that falls within the scope of MEMS technologies. For example, MEMS device 202 may be any mechanical and electronic structure having a critical dimension of less than approximately 250 microns and fabricated using lithography, deposition, and etching processes above a substrate. In accordance with an embodiment of the present invention, MEMS device 202 is a device such as, but not limited to, a resonator (such as an oscillator), a temperature sensor, a pressure sensor or an inertial sensor (such as an accelerometer or a gyroscope). Suspended portion 208 of member 206 may be any suspended feature having a resonant frequency. For example, in an embodiment, suspended portion 208 is a feature such as, but not limited to, a beam, a plate or a tuning fork. In a specific embodiment, suspended portion 208 is a cantilever arm, as depicted in FIG. 2.

Member 206 may have any dimensions suitable for a desired MEMS function. For example, in accordance with an embodiment of the present invention, MEMS device 202 includes a cantilever arm 208. The length of member 206 is approximately in the range of 1-250 microns and the length of cantilever arm 208 makes up a portion of the length of member 206 approximately in the range of 50-90%. The height of member 206 is approximately in the range of 0.1-10 microns and the width at portion 208 is approximately in the range of 0.1-100 microns. In one embodiment, the length of member 206 is approximately in the range of 70-90 microns, the height of member 206 is approximately in the range of 0.5-5 microns and the width at portion 208 is approximately in the range of 0.5-5 microns. The distance that suspended portion 208 is suspended above isolation stack 214 may be selected to mitigate the acoustic back-scattering for a desired MEMS function. In one embodiment, the distance that suspended portion 208 is suspended above isolation stack 214 is approximately in the range of 0.1-5 microns. The spacing between suspended portion 208 and electrodes 210 and 212 may be sufficient to generate and collect high quality signals without interfering with a resonating mode of suspended portion 208. In one embodiment, the spacing between suspended portion 208 and electrodes 210 and 212 is approximately in the range of 100-500 nanometers.

Member 206, and thus suspended portion 208, may be formed from any material suitable to withstand a MEMS fabrication process. For example, in accordance with an embodiment of the present invention, member 206 is composed of a material such as, but not limited to, an insulator, a semiconductor or a conductor. In one embodiment, member 206 is composed of an insulating material such as, but not limited to, silicon dioxide, silicon nitride, silicon oxy-nitride or a high-K dielectric material. In one embodiment, member 206 is composed of a semiconducting material such as, but not limited to, silicon, germanium, silicon-germanium, carbon-doped silicon, carbon-doped silicon-germanium and a III-V material. The semiconducting material may also be composed of dopant impurity atoms. For example, in a specific embodiment, member 206 is composed of polycrystalline silicon-germanium with a germanium atomic concentration approximately in the range of 50-70% and boron dopant impurity atoms with a total atomic concentration approximately in the range of $1 \times 10^{18}$-$5 \times 10^{20}$ atoms/cm$^3$. In one embodiment, member 206 is composed of a conductor and is formed from a material such as, but not limited to, copper, aluminum, a metal alloy or a metal silicide. Member 206 may be composed of a material that is formed by a low temperature process, below the threshold temperature of CMOS architecture 204. Thus, in accordance with another embodiment of the present invention, member 206 is composed of a material formed at a temperature less than approximately 450° C.

Driver electrode 210 and sensor electrode 212 may be composed of any material described in association with member 206. In accordance with an embodiment of the present invention, driver electrode 210 and sensor electrode 212 are composed of substantially the same material as member 206. In one embodiment, driver electrode 210, sensor electrode 212 and member 206 are in the same plane, as depicted in FIG. 2. Dummy structures 250 may be formed near driver electrode 210 and sensor electrode 212 and may be composed of the same structural material as driver electrode 210 and sensor electrode 212. In one embodiment, dummy structures 250 are formed to optimize the topography of structures above isolation stack 214 and thus optimize the fabrication process for MEMS device 202.

First set of couplers 222, used to couple driver electrode 210 and sensor electrode 212 with electrical contacts 220, may be composed of any conductive material suitable to withstand a MEMS fabrication process. For example, in accordance with an embodiment of the present invention, first set of couplers 222 is composed of a material such as, but not limited to, a semiconductor material heavily doped with charge-carrier impurity atoms or a conductor. In one embodiment, first set of couplers 222 is composed of a heavily doped semiconducting material such as, but not limited to, silicon, germanium, silicon-germanium, carbon-doped silicon and a III-V material. In a specific embodiment, first set of couplers 222 is composed of a group IV material heavily doped with charge-carrier impurity atoms such as, but not limited to, boron, indium, phosphorus, arsenic or antimony. For example, in a particular embodiment, first set of couplers 222 is composed of polycrystalline silicon-germanium with a germanium atomic concentration approximately in the range of 55-95% and boron dopant impurity atoms with a total atomic concentration approximately in the range of $1\times10^{20}$-$5\times10^{22}$ atoms/cm$^3$. In another specific embodiment, first set of couplers 222 is composed of a group III-V material heavily doped with charge-carrier impurity atoms such as, but not limited to, carbon, silicon, germanium, oxygen, sulfur, selenium or tellurium. In one embodiment, first set of couplers 222 is composed of a conductor and is formed from a material such as, but not limited to, copper, aluminum, a metal alloy or a metal silicide. A low temperature process may be used to form first set of couplers 222. Thus, in accordance with an embodiment of the present invention, first set of couplers 222 is composed of a material formed at a temperature less than approximately 450° C. First set of couplers 222 may be composed of a material having a low resistivity. For example, in one embodiment, first set of couplers 222 is composed of a material having a volume resistivity less than approximately $1\times10^{-5}$ ohms·cm. In comparison with driver electrode 210 and sensor electrode 212, first set of couplers 222 may be relatively more conductive. In an embodiment, first set of couplers 222 is at least twice as conductive as driver electrode 210 and sensor electrode 212. In an alternative embodiment, first set of couplers 222 is composed of substantially the same material as member 206, driver electrode 210 and sensor electrode 212. In accordance with an embodiment of the present invention, first set of couplers 222 is for electrically coupling MEMS device 202 with the plurality of interconnects 216. In a specific embodiment, first set of couplers 222 is electrically coupled with the plurality of interconnects 216 via electrical contacts 220 housed in isolation stack 214, as depicted in FIG. 2.

Second set of couplers 224 may be composed of any material described in association with first set of couplers 222. In accordance with an embodiment of the present invention, second set of couplers 224 is composed of substantially the same material as first set of couplers 222. Second set of couplers may be composed of a material suitable to anchor member 206. Thus, in accordance with an embodiment of the present invention, second set of couplers 224 is composed of the same material as first set of couplers 222, but second set of couplers 224 is for anchoring member 206 while first set of couplers 222 is for electrically coupling driver electrode 210 and sensor electrode 212 with the plurality of interconnects 216. In one embodiment, second set of couplers 224 is also electrically coupled with the plurality of interconnects 216. In an alternative embodiment, second set of couplers 224 is electrically isolated from the plurality of interconnects 216.

Isolation stack 214 may be composed of any material suitable to electrically isolate member 208 of MEMS device 202 from cross-talk noise emitted from the plurality of interconnects 216. For example, isolation stack 214 may be composed of an insulating layer. In one embodiment, the insulating layer is composed of a material such as, but not limited to, silicon dioxide, silicon nitride, silicon oxy-nitride or a high-k dielectric layer. Isolation stack 214 may also be composed of a highly resistive material. In accordance with an embodiment of the present invention, isolation stack 214 is composed of a highly resistive material having a volume resistivity of greater than approximately $1\times10^{-5}$ ohms·cm.

The plurality of interconnects 216 may be composed of a set of conductive lines suitable to conduct a current flow. The conductive lines may be housed in a dielectric layer suitable to provide structural integrity to the plurality of interconnects 216 and to mitigate cross-talk within the plurality of interconnects 216. In an embodiment, the conductive metal lines are composed of a material such as, but not limited to, copper, silver, aluminum, an alloy thereof, or bundles of conductive carbon nanotubes. In one embodiment, the conductive metal lines are composed of polycrystalline copper with an atomic composition approximately in the range of 97-100% copper atoms. The conductive metal lines may exhibit any cross-sectional shape and follow any design rule practical for interconnect technologies. In accordance with an embodiment of the present invention, the cross-sectional shape is a shape such as, but not limited to, a square, a rectangle, a circle, an ellipse, a U, a V, a T or an A-frame. In one embodiment, the cross-sectional shape of the conductive metal lines is an artifact of the processing scheme utilized to form the plurality of interconnects 216. In a particular embodiment, at least one of the driver electrode 210 or the sensor electrode 212 is coupled with the plurality of interconnects 216 by a coaxial contact 270, extending through to the plurality of semiconductor devices 218, as depicted in FIG. 2. In an embodiment, the dielectric layer that houses the conductive metal lines has a dielectric constant approximately in the range of 2-5.5. In one embodiment, the dielectric layer that houses the conductive metal lines is composed of a material such as, but not limited to, silicon dioxide, a silicate, a carbon-doped oxide with approximately 0-10% porosity, or fluorinated versions thereof.

As depicted in FIG. 2, the plurality of interconnects 216 is coupled with the plurality of semiconductor devices 218 via device contacts 226. Device contacts 226 may be composed of any conductive material suitable to withstand a integrated circuit processing scheme. In one embodiment, device contacts 226 are composed of any of the materials described in association with first set of couplers 222 and second set of couplers 224. The plurality of semiconductor devices 218 may be any grouping of microelectronic devices that may be connected to form an integrated circuit. For example, in accordance with an embodiment of the present invention, the plurality of semiconductor devices is composed of a plurality of N-type and P-type transistors fabricated in a substrate 230 and encased in a dielectric layer 232. The individual semiconductor devices 228 may be nested devices 228A or isolated devices 228B. Substrate 230 may be composed of any material suitable to withstand an integrated circuit fabrication process and to provide structural integrity for the plurality of semiconductor devices 218, the plurality of interconnects 216 and MEMS device 202. In an embodiment, substrate 230 is composed of group IV-based materials such as, but not limited to, crystalline silicon, germanium or silicon-germanium. In another embodiment, substrate 230 is composed of a III-V material. Substrate 230 may also include an insulating layer. In one embodiment, the insulating layer is composed of a material such as, but not limited to, silicon dioxide, silicon nitride, silicon oxy-nitride or a high-k dielectric layer. Substrate 230 may be an insulator. In one embodiment, substrate 230 is composed substantially of a material such as, but not limited to, glass, quartz or sapphire. Dopant impurity regions 234 and isolation regions 236 may also be formed in substrate 230.

Figure 3A:
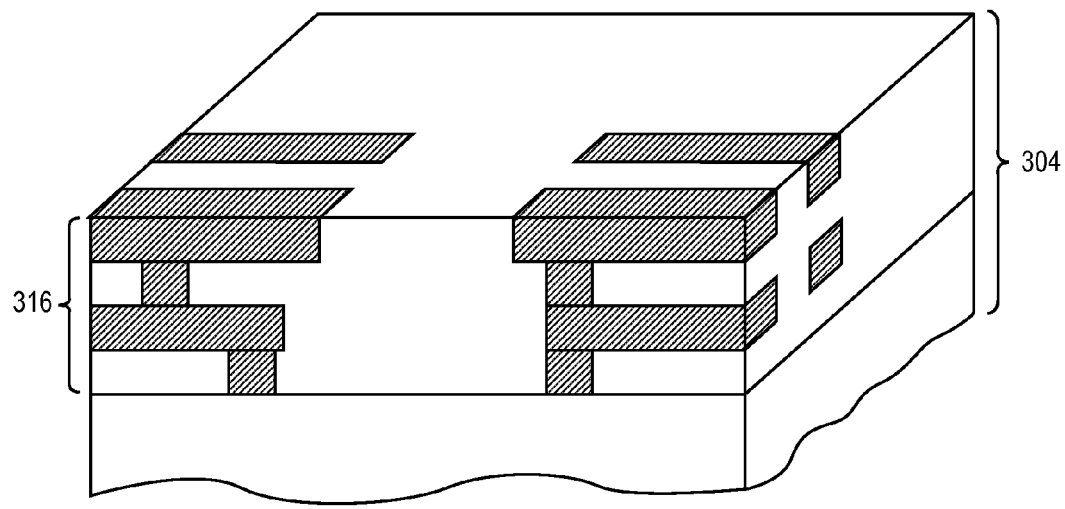
FIGS. 3A-3R illustrate cross-sectional views representing a series of steps for fabricating an integrated circuit-compatible MEMS device, in accordance with an embodiment of the present invention.

In an aspect of the present invention, a MEMS device disposed above, but on the same substrate as, a CMOS architecture may be fabricated subsequent to the fabrication of the CMOS architecture. FIGS. 3A-3R illustrate cross-sectional views representing a series of steps for fabricating an integrated circuit-compatible MEMS device, in accordance with an embodiment of the present invention.

Referring to FIG. 3A, a CMOS architecture 304 is provided comprising a plurality of interconnects 316 and a plurality of semiconductor devices (not shown). CMOS architecture 304 and, hence, the plurality of interconnects 316 may be composed of any material or have any feature described in association with CMOS architecture 204 and the plurality of interconnects 216, respectively, from FIG. 2. In accordance with an embodiment of the present invention, the tolerable threshold temperature for CMOS architecture 304, i.e. the temperature up to which CMOS architecture 304 can be heated with negligible permanent degradation, is approximately 450 degrees Celsius.

Figure 3B:
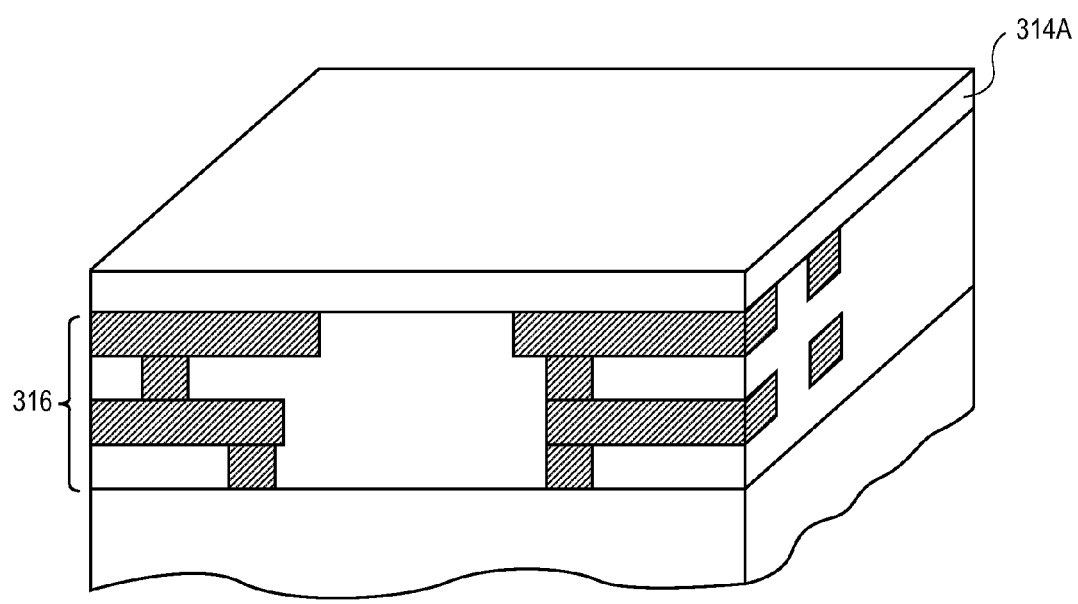

Referring to FIG. 3B, an isolation layer 314A is deposited above the plurality of interconnects 316 to form the first portion of an isolation stack. Isolation layer 314A may be composed of any material suitable to act as an insulator layer. In accordance with an embodiment of the present invention, isolation layer 314A is composed of any material described in association with isolation stack 214 from FIG. 2. Isolation layer 314A may be deposited by any process suitable to provide substantially uniform coverage above the plurality of interconnects 316. In one embodiment, isolation layer 314A is composed of silicon dioxide and is deposited by a chemical vapor deposition process carried out at a temperature less than approximately 450 degrees Celsius. Isolation layer 314A may be substantially flat. In one embodiment, isolation layer 314A is planarized by a chemical-mechanical process following its deposition. In a specific embodiment, the plurality of interconnects 316 is planarized prior to the deposition of isolation layer 314A. Isolation layer 314A may have a thickness suitable to suppress cross-talk from the plurality of interconnects 316 with any devices subsequently fabricated above isolation layer 314A. In one embodiment, isolation layer 314A has a thickness approximately in the range of 0.1-0.5 microns.

Figure 3C:
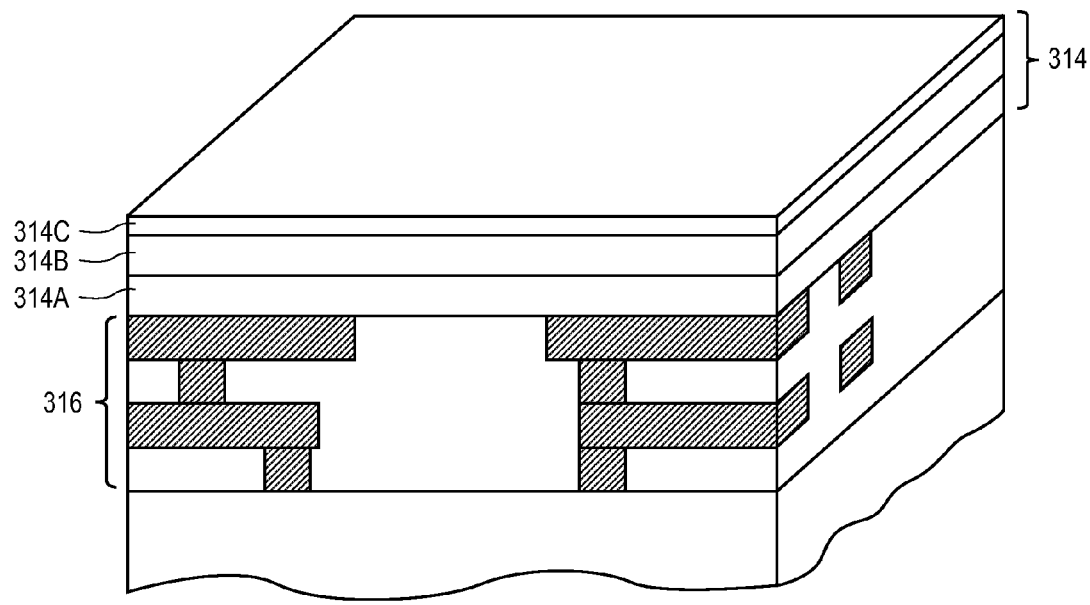

Referring to FIG. 3C, the remaining portion of an isolation stack 314, composed of isolation layer 314A, passivation layer 314B and interface layer 314C, is formed above the plurality of interconnects 316. Passivation layer 314B may be composed of any material suitable to house conductive electrodes. In accordance with an embodiment of the present invention, passivation layer 314B is composed of any material described in association with isolation stack 214 from FIG. 2. Passivation layer 314B may be deposited by any process suitable to provide substantially uniform coverage above isolation layer 314A. In one embodiment, passivation layer 314B is composed of silicon nitride and is deposited by a chemical vapor deposition process carried out at a temperature less than approximately 450 degrees Celsius. Passivation layer 314B may have a thickness suitable to form reliable electrical contacts between the plurality of interconnects 316 and a subsequently formed MEMS device. In one embodiment, passivation layer 314B has a thickness approximately in the range of 0.1-1 microns.

Interface layer 314C may be composed of any material suitable to act as an etch stop layer during subsequent processing steps. In accordance with an embodiment of the present invention, interface layer 314C is composed of any material described in association with isolation stack 214 from FIG. 2. Interface layer 314C may be deposited by any process suitable to provide substantially uniform coverage above passivation layer 314B. In one embodiment, interface layer 314C is composed of silicon dioxide and is deposited by a chemical vapor deposition process carried out at a temperature less than approximately 450 degrees Celsius. Interface layer 314C may be substantially flat. In one embodiment, interface layer 314C is planarized by a chemical-mechanical process following its deposition. Interface layer 314C may have a thickness suitable to provide an etch stop durable for a multitude of processing steps without exposing passivation layer 314B. In one embodiment, interface layer 314C has a thickness approximately in the range of 0.1-0.2 microns.

Figure 3D:
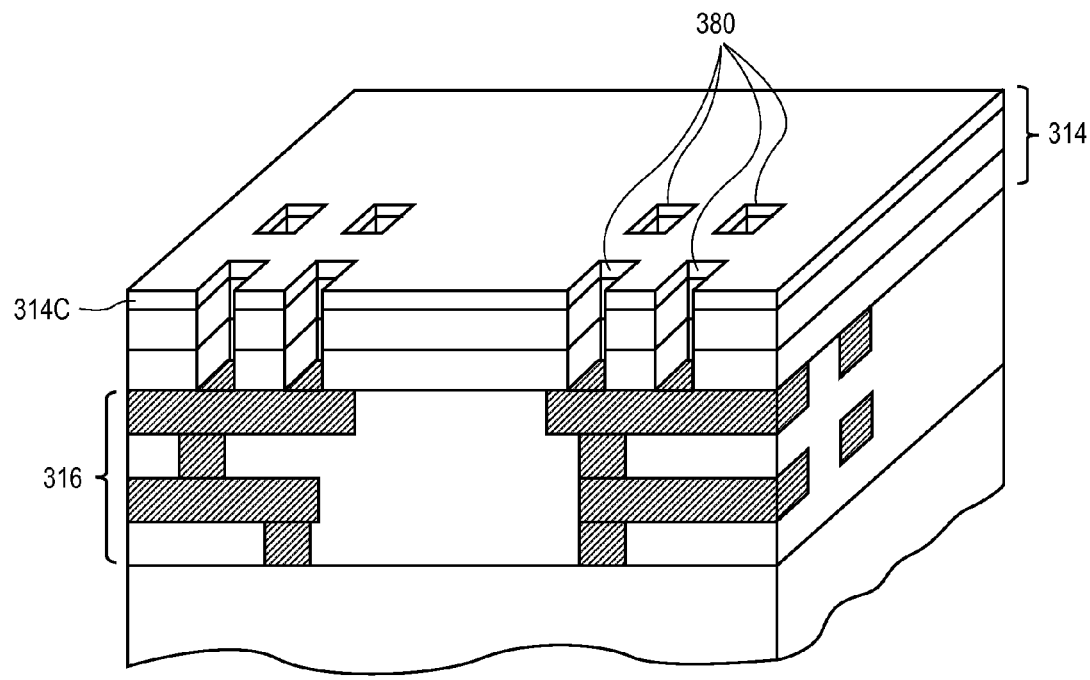

Referring to FIG. 3D, contact holes 380 are formed in isolation stack 314 to expose interconnect lines from the plurality of interconnects 316. Isolation stack 314 may be patterned by any lithographic and etch process suitable to provide the appropriate dimensions required for contact holes 380. For example, in accordance with an embodiment of the present invention, isolation stack 314 is patterned by first patterning a positive photo-resist layer above isolation stack 314 by exposure to a wavelength of light such as, but not limited to, 248 nm, 193 nm or 157 nm. In another embodiment, an e-beam direct-write process is used to pattern the positive photo-resist layer. An etch process may then be used to pattern isolation stack 314. In one embodiment, a dry etch process is used. In a particular embodiment, isolation stack 314 is composed of layers in the order silicon dioxide/silicon nitride/silicon dioxide and the dry etch process includes an anisotropic plasma etch process wherein the plasma is generated from a combination of gases such as $CHF_3$, $CF_4$ and $O_2$. In one embodiment, interface layer 314C acts as a hard-mask layer underneath the positive photo-resist. Contact holes 380 may have any dimension suitable to define an effective electrical contact in a subsequent processing step. In one embodiment, the height:width aspect ratio of each contact hole 380 is approximately in the range of 5:1-10:1.

Figure 3E:
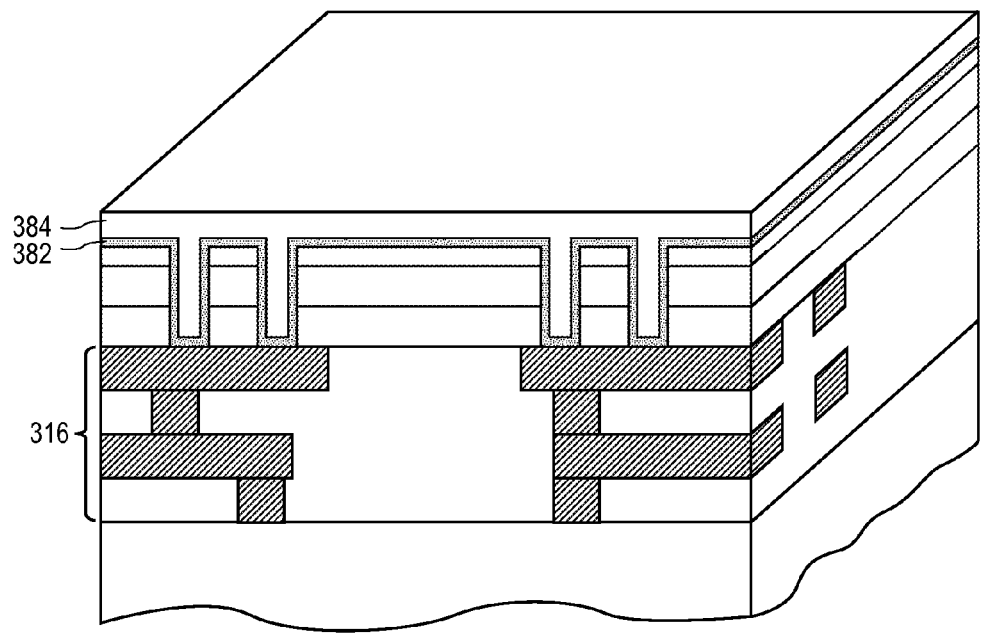

Referring to FIG. 3E, contact holes 380 are filled with contact-forming material layers. A first contact layer 382 lines contact holes 380 and a second contact layer 384 fills any remaining voids in contact holes 380. First contact layer 382 may be composed of any conductive material that can act as a suitable adhesion layer. In one embodiment, first contact layer 382 is an adhesion layer composed of a material that provides an optimal ohmic contact between metal lines in the plurality of interconnects 316 and second contact layer 384. In a specific embodiment, first contact layer 382 is composed substantially of titanium. First contact layer 382 may be formed by any technique suitable to provide a conformal layer on the sidewalls of contact holes 380 and on the surface of plurality of interconnects 316. In one embodiment, first contact layer 382 is deposited by a sputter deposition process to a thickness approximately in the range of 10-100 nanometers. In a specific embodiment, a layer of titanium nitride is formed in between first contact layer 382 and second contact layer 384 in order to enhance the adhesion between first contact layer 382 and second contact layer 384. In one embodiment, a sputter-clean is carried out prior to the deposition of first contact layer 382.

Second contact layer 384 may be composed of any conductive material that can suitably adhere to first contact layer 382. In an embodiment, second contact layer 384 is a highly conductive semiconductor layer formed at a temperature less than approximately 450 degrees Celsius. In one embodiment, second contact layer 384 is composed substantially of silicon germanium doped with boron dopant impurity atoms. In a specific embodiment, second contact layer 384 is composed of silicon-germanium in the approximate ratio of 30:70 with a boron atomic concentration approximately in the range of $10^{18}$-$10^{21}$ atoms/cm$^3$. Second contact layer 384 may be formed by any technique suitable to fill the remaining voids of contact holes 380. In one embodiment, second contact layer 384 is deposited by a chemical vapor deposition process utilizing the gases $SiH_4$, $GeH_4$ and $BCl_3$ at a temperature approximately in the range of 400-450 degrees Celsius. In a specific embodiment, the deposition process forms silicon-germanium with a grain size approximately in the range of 75-125 nanometers.

Figure 3F:
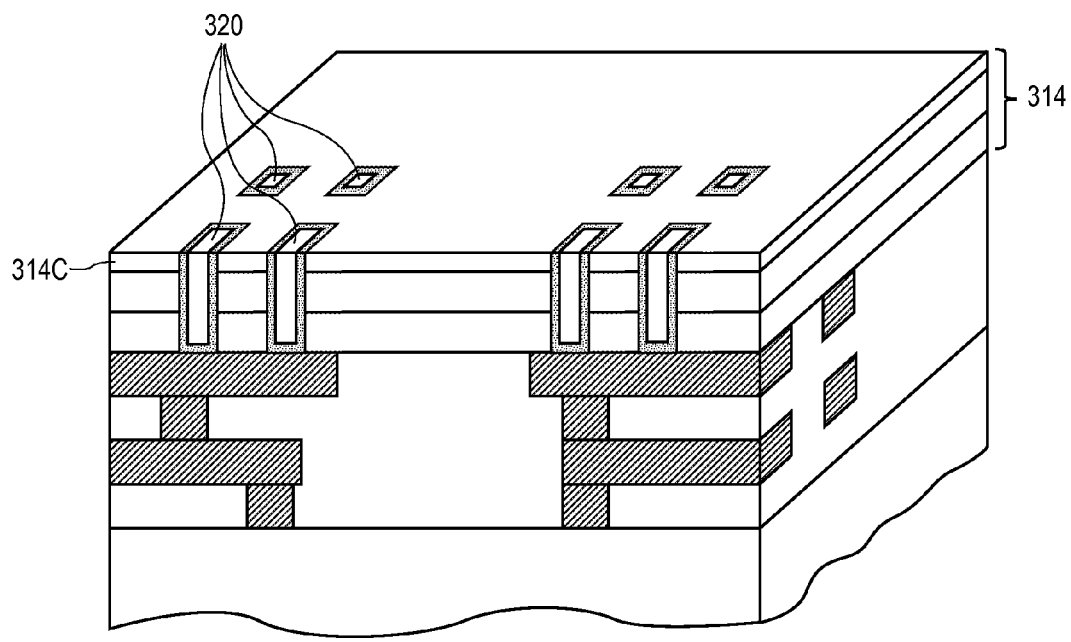

Referring to FIG. 3F, excess material from first contact layer 382 and second contact layer 384 is removed to provide electrical contacts 320 and to expose interface layer 314C of isolation stack 314. The excess material may be removed by any process suitable to leave contact holes substantially filled and to minimally impact interface layer 314C. For example, in accordance with an embodiment of the present invention, the excess material is removed by a chemical-mechanical polish process step. In another embodiment, the excess material is removed with a dry etch back process. In a specific embodiment, the excess material is removed by a plasma etch-back step including a plasma formed from gases such as, but not limited to, $SF_6$ or the combination of $Cl_2$, HBr, $O_2$ and $BCl_3$. In one embodiment, alignment marks are formed in the surface of interface layer 314C prior to the deposition of first release layer 390, described below.

Figure 3G:
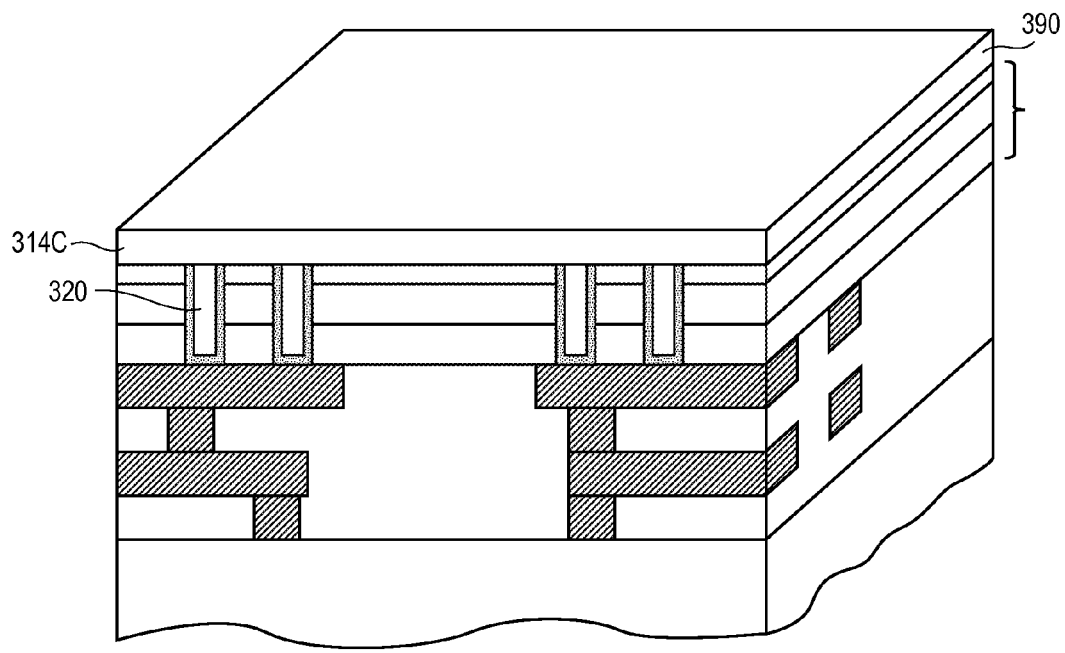

Referring to FIG. 3G, a first release layer 390 is deposited above isolation stack 314 and electrical contacts 320. First release layer 390 may be composed of any material suitable to withstand a MEMS fabrication process. For example, in accordance with an embodiment of the present invention, first release layer 390 is composed of a material such as, but not limited to, an insulator or a semiconductor. In one embodiment, first release layer 390 is composed of an insulating material and is composed of a material such as, but not limited to, silicon dioxide, silicon nitride, silicon oxy-nitride or a high-K dielectric material. In one embodiment, first release layer 390 is composed of a semiconducting material such as, but not limited to, silicon, germanium, silicon-germanium, carbon-doped silicon or a III-V material. The semiconducting material may also be composed of dopant impurity atoms. For example, in one embodiment, the concentration of dopant impurity atoms is selected to optimize the germanium nucleation from $GeH_4$ precursor gas at a temperature approximately in the range of 300-400° C. In a specific embodiment, first release layer 390 is composed of greater than approximately 98% germanium atoms and boron dopant impurity atoms having a total atomic concentration approximately in the range of $5\times10^{19}$-$5\times10^{20}$ atoms/cm$^3$. First release layer 390 may be composed of any material that may subsequently be removed with high selectivity to interface layer 314C and a subsequently formed structural layer. For example, in accordance with an embodiment of the present invention, interface layer 314C is composed of an insulator layer, a subsequently formed structural layer is composed of silicon-germanium and first release layer 390 is composed substantially of germanium. In a specific embodiment, both the silicon-germanium structural layer and the germanium release layer 390 are doped with boron dopant impurity atoms. The thickness of first release layer 390 may be any thickness suitable to provide a suspended member at a desired distance above an isolation stack. Thus, in accordance with an embodiment of the present invention, the thickness of first release layer 390 is substantially the same as the height which suspended member 208 is suspended above isolation stack 214, described in association with FIG. 2.

Figure 3H:
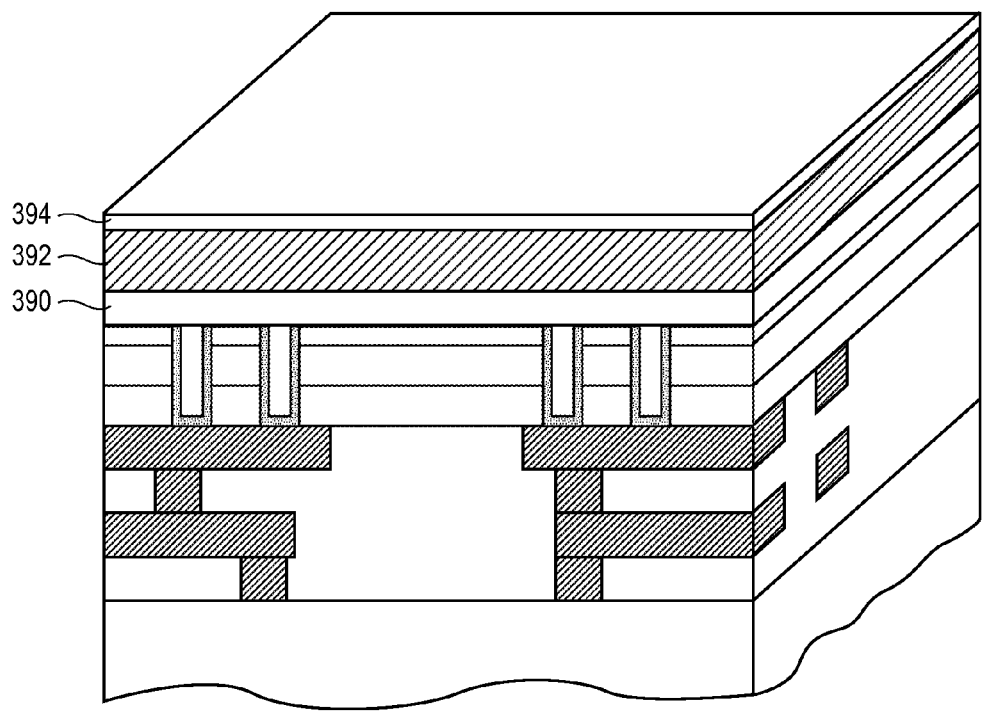

Referring to FIG. 3H, a first structural layer 392 is formed above first release layer 390. First structural layer 390 may be composed of any material and have any thickness described in association with member 206 from FIG. 2. First structural layer 392 and first release layer 390 may be formed by any suitable deposition process that generates uniform material layers of consistent composition. For example, in accordance with an embodiment of the present invention, first structural layer 392 and first release layer 390 are deposited by a process such as, but not limited to, chemical vapor deposition, physical vapor deposition, atomic layer deposition, electroplating or electro-less plating. First structural layer 392 and first release layer 390 may be deposited by a low temperature deposition process. In one embodiment, first structural layer is deposited by a chemical vapor deposition using gases such as $SiH_4$, $GeH_4$ and $BCl_3$ and first release layer is deposited by a chemical vapor deposition using gases such as $GeH_4$ and $BCl_3$. In a specific embodiment, first structural layer 392 and first release layer 390 are deposited by a low-pressure chemical vapor deposition process at a temperature less than approximately 450° C. A hard-mask layer 394 may be deposited above first structural layer 392, as depicted in FIG. 3H. In one embodiment, hard-mask layer 394 is composed of a material such as, but not limited to, silicon dioxide or silicon oxy-nitride. In a specific embodiment, hard-mask layer 394 is composed of silicon dioxide formed by a plasma-enhanced chemical vapor deposition process step.

Figure 3I:
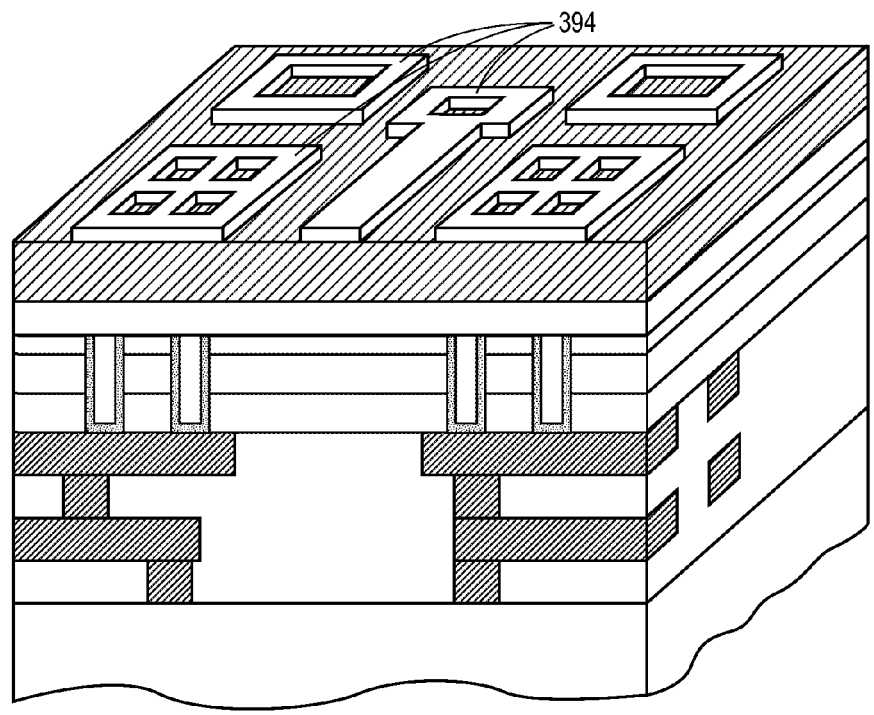

Referring to FIG. 3I, hard-mask layer 394 is patterned with features desirable for the fabrication of a MEMS device. Hard-mask layer 394 may be patterned by any suitable patterning process that provides well-defined features of the appropriate dimensions. For example, in accordance with an embodiment of the present invention, hard-mask layer 394 is patterned by first patterning a positive photo-resist layer above hard-mask layer 394 by exposure to a wavelength of light such as, but not limited to, 248 nm, 193 nm or 157 nm. In another embodiment, an e-beam direct-write process is used to pattern the positive photo-resist layer. In one embodiment, hard-mask layer 394 is etched by a dry etch process utilizing gases such as $CHF_3$, $CF_4$ and $O_2$.

Figure 3J:
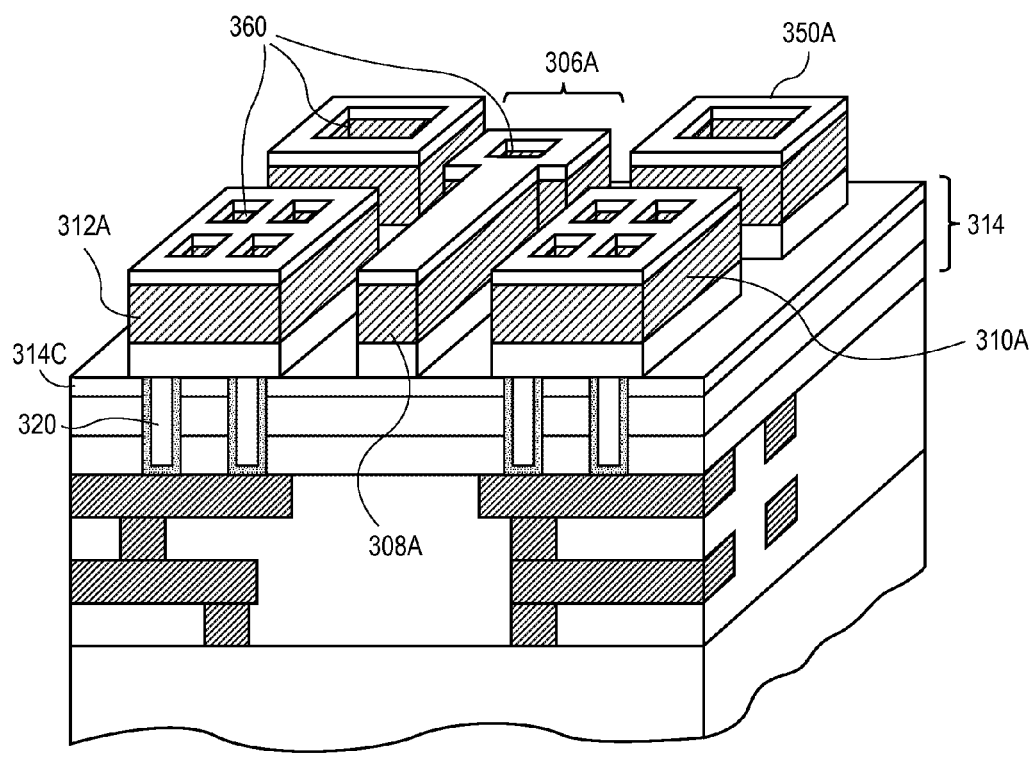

Referring to FIG. 3J, first structural layer 392 and first release layer 390 are patterned to form pre-coupled member 306A, pre-coupled electrodes 310A and 312A and pre-coupled dummy structures 350A. The width and length of the pre-suspended portion 308A of pre-coupled member 306A may be any width and length described in association with suspended portion 208 from FIG. 2. A dry etch process may be used to pattern first structural layer 392 and first release layer 390. In one embodiment, first structural layer 392 is composed of silicon-germanium, first release layer 390 is composed of germanium and the dry etch process includes using gases such as HBr, $Cl_2$ and $O_2$. In one embodiment, interface layer 314C acts as an etch stop during the patterning of first structural layer 392 and first release layer 390. Coupler holes 360 may also be formed in pre-coupled member 306A, pre-coupled electrodes 310A and 312A and pre-coupled dummy structures 350A, as depicted in FIG. 3J. In accordance with an embodiment of the present invention, coupler holes 360 of pre-coupled electrodes 310A and 312A are substantially aligned with electrical contacts 320 while coupler holes 360 of pre-coupled member 306A are aligned with the top surface of interface layer 314C and, thus, isolation stack 314.

Figure 3K:
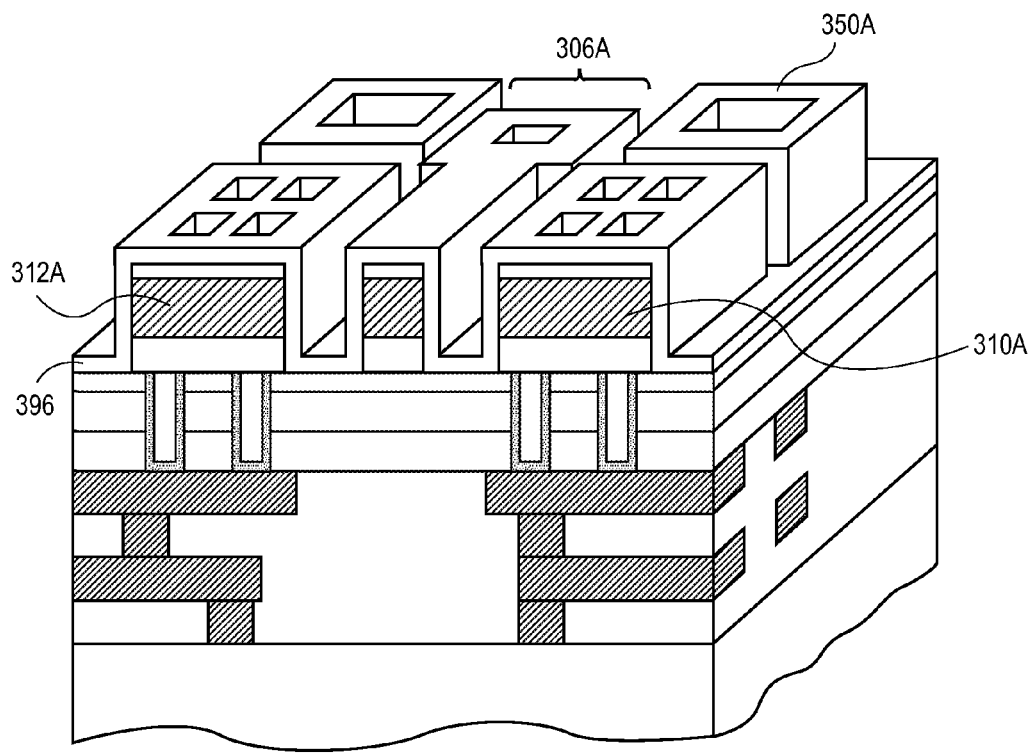

Referring to FIG. 3K, a second release layer 396 is deposited above pre-coupled member 306A, pre-coupled electrodes 310A and 312A and pre-coupled dummy structures 350A. Second release layer 396 may be composed of any material described in association with first release layer 390 from FIG. 3G. In accordance with an embodiment of the present invention, second release layer 396 is formed from substantially the same material as first release layer 390. In an alternative embodiment, second release layer 396 is formed from a different material than first release layer 390. Second release layer may be formed to a thickness suitable to provide a spacing between pre-suspended portion 308A and a subsequently formed second structural layer. In one embodiment, the thickness of second release layer 396 is approximately in the range of the spacing between suspended portion 208 and electrodes 210 and 212, described in association with FIG. 2.

Figure 3L:
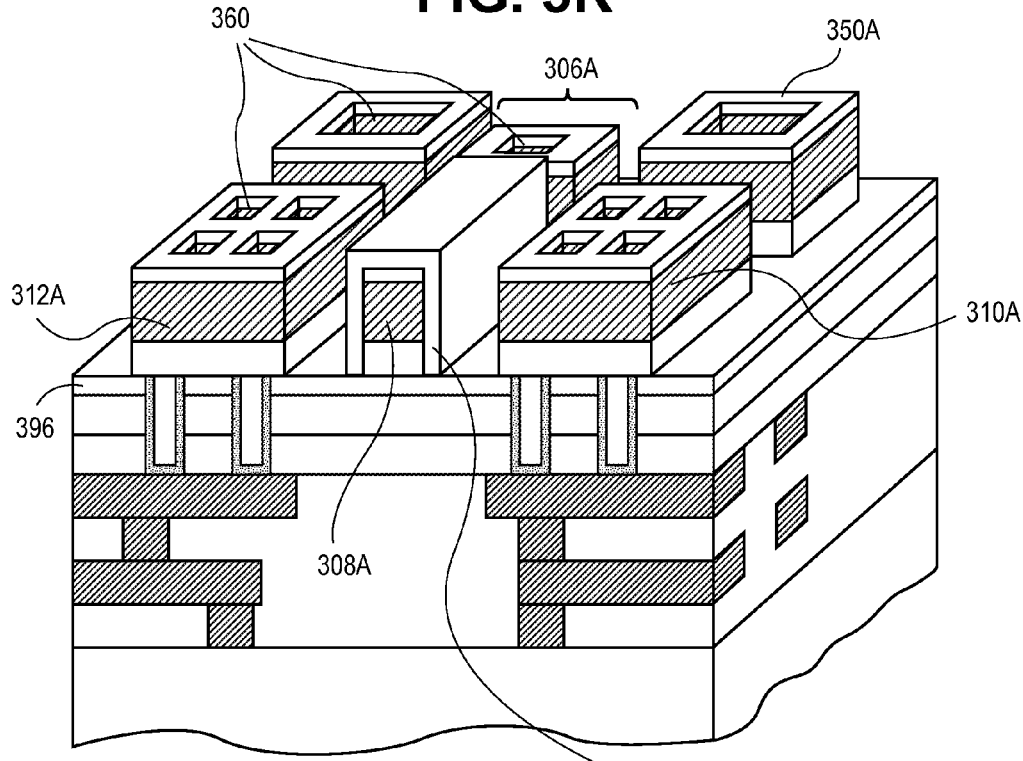

Referring to FIG. 3L, second release layer 396 is patterned to form sidewall release layer 397 surrounding pre-suspended portion 306A of pre-coupled member 306A. Second release layer 396 may be patterned with a mask designed to retain portions of second release layer 396 on pre-suspended portion 308A, while enabling removal from the sidewalls of pre-coupled electrodes 310A and 312A and from inside coupler holes 360, as depicted in FIG. 3L. In one embodiment, second release layer 396 is composed substantially of germanium atoms and is patterned with a dry etch process including gases such as $SF_6$ or the combination of $Cl_2$, HBr, $O_2$ and $BCl_3$. In one embodiment, interface layer 314C acts as an etch stop during the patterning of second release layer 396.

Figure 3M:
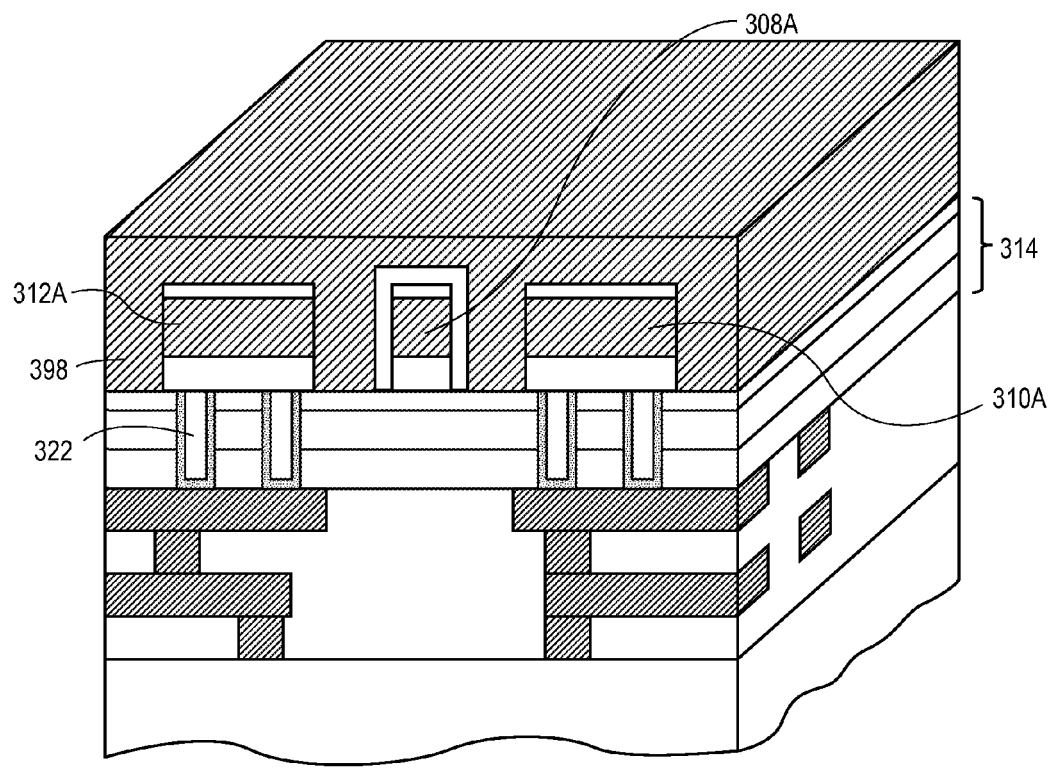

Referring to FIG. 3M, a second structural layer 398 is deposited above pre-coupled member 306A and pre-coupled electrodes 310A and 312A and in coupler holes 360, in order to form couplers. Second structural layer may be composed of any material and deposited by any technique described in association with first structural layer 392 from FIG. 3H. In accordance with an embodiment of the present invention, second structural layer 398 is composed of substantially the same material as first structural layer 392. Alternatively, second structural layer 398 may be composed of a highly conductive material. For example, in accordance with an embodiment of the present invention, second structural layer 398 is composed of a material such as, but not limited to, a semiconductor material heavily doped with charge-carrier impurity atoms or a conductor. In one embodiment, second structural layer 398 is a heavily doped semiconducting material such as, but not limited to, silicon, germanium, silicon-germanium, carbon-doped silicon or a III-V material. In a specific embodiment, second structural layer 398 is composed of a group IV material and is heavily doped with charge-carrier impurity atoms such as, but not limited to, boron, indium, phosphorus, arsenic or antimony. For example, in a particular embodiment, second structural layer 398 is composed of polycrystalline silicon-germanium with a germanium atomic concentration approximately in the range of 55-95% and boron dopant impurity atoms with a total atomic concentration approximately in the range of $1 \times 10^{20}$-$5 \times 10^{22}$ atoms/cm$^3$.

In another embodiment, second structural layer 398 is composed of a group III-V material and is heavily doped with charge-carrier impurity atoms such as, but not limited to, carbon, silicon, germanium, oxygen, sulfur, selenium or tellurium. In one embodiment, second structural layer 398 is composed of a conductor and is formed from a material such as copper, aluminum, a metal alloy or a metal silicide. A low temperature process may be used to form second structural layer 398. Thus, in accordance with another embodiment of the present invention, second structural layer 398 is composed of a material formed at a temperature less than approximately 450° C. Additionally, second structural layer 398 may be composed of a material having a low resistivity. For example, in one embodiment, second structural layer 398 is composed of a material having a volume resistivity less than approximately $1 \times 10^{-5}$ ohms·cm. In comparison with first structural layer 392, second structural layer 398 may be relatively more conductive than first structural layer 392. In an embodiment, second structural layer 398 is at least twice as conductive as first structural layer 392. In accordance with an embodiment of the present invention, second structural layer 398 is for electrically coupling pre-coupled electrodes 310A and 312A with electrical contacts 320 and for anchoring pre-coupled member 306A to isolation stack 314.

Figure 3N:
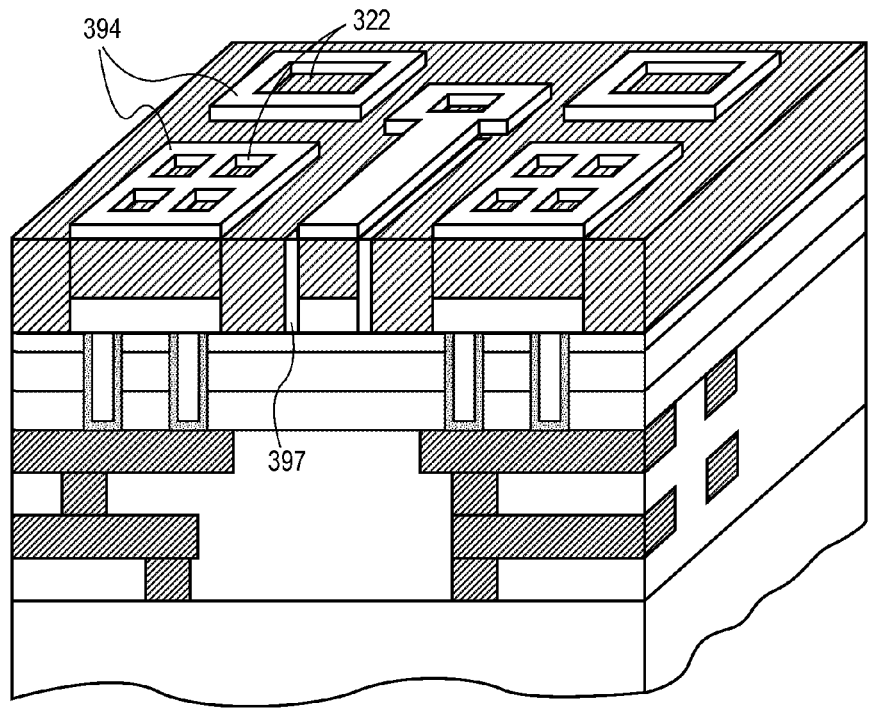

Referring to FIG. 3N, second structural layer 398 is etched-back to expose hard-mask layer 394, sidewall release layer 397 and couplers 322. In an embodiment, second release layer 396 is composed substantially of silicon-germanium and is etched-back with a dry etch process including gases such as $SF_6$ or the combination of $Cl_2$, HBr, $O_2$ and $BCl_3$. In one embodiment, hard-mask layer 394 acts as an end-point determiner during the etch-back of second structural layer 398.

Figure 3O:
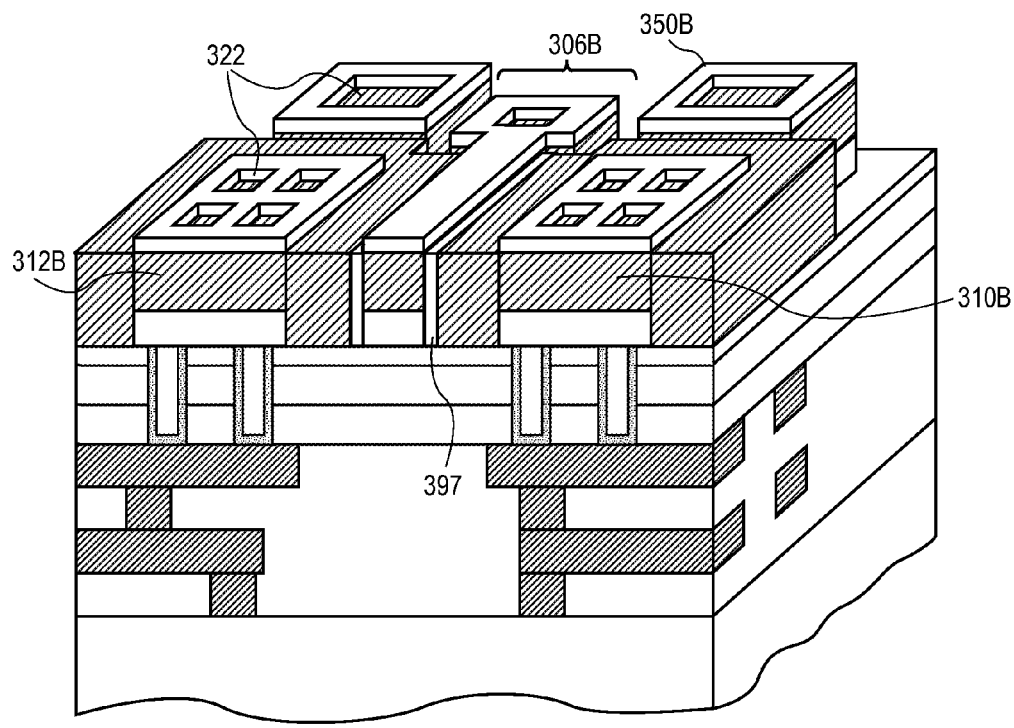

Referring to FIG. 3O, second structural layer 398 is patterned to form coupled member 306B, coupled electrodes with extensions 310B and 312B and coupled dummy structures 350B. Second structural layer may be patterned with any process described in association with the patterning of first structural layer 392 and with any design to provide the desired extension on pre-coupled electrodes 310A and 312B, in addition to providing couplers 322. For example, in accordance with an embodiment of the present invention, second structural layer 398 is patterned to form electrode extensions on coupled electrodes with extensions 310B and 312B, wherein the extensions are directly adjacent to sidewall release layer 397.

Figure 3P:
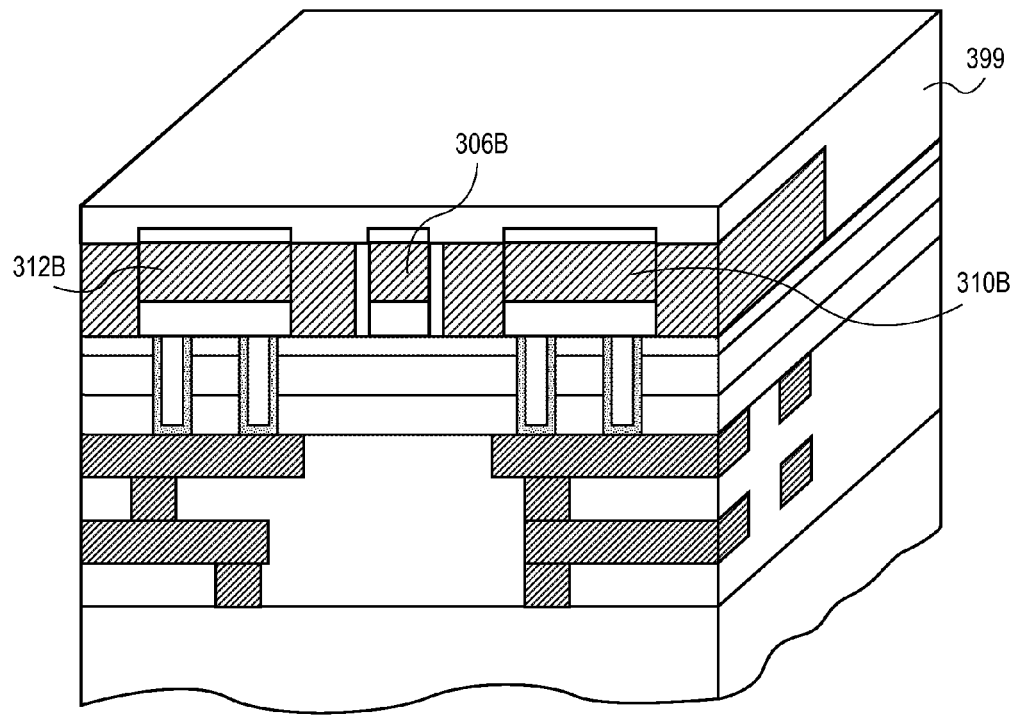

Referring to FIG. 3P, a sacrificial polish layer 399 is deposited above coupled member 306B, coupled electrodes with extensions 310B and 312B and coupled dummy structures 350B. Sacrificial polish layer 399 may be composed of any material suitable to withstand a uniform planarization process and that can be deposited at a temperature less than approximately 450 degrees Celsius. In accordance with an embodiment of the present invention, sacrificial polish layer 399 is composed of any material described in association with first release layer 390 and second release layer 396. In a specific embodiment, sacrificial polish layer 399 is composed substantially of germanium.

Figure 3Q:
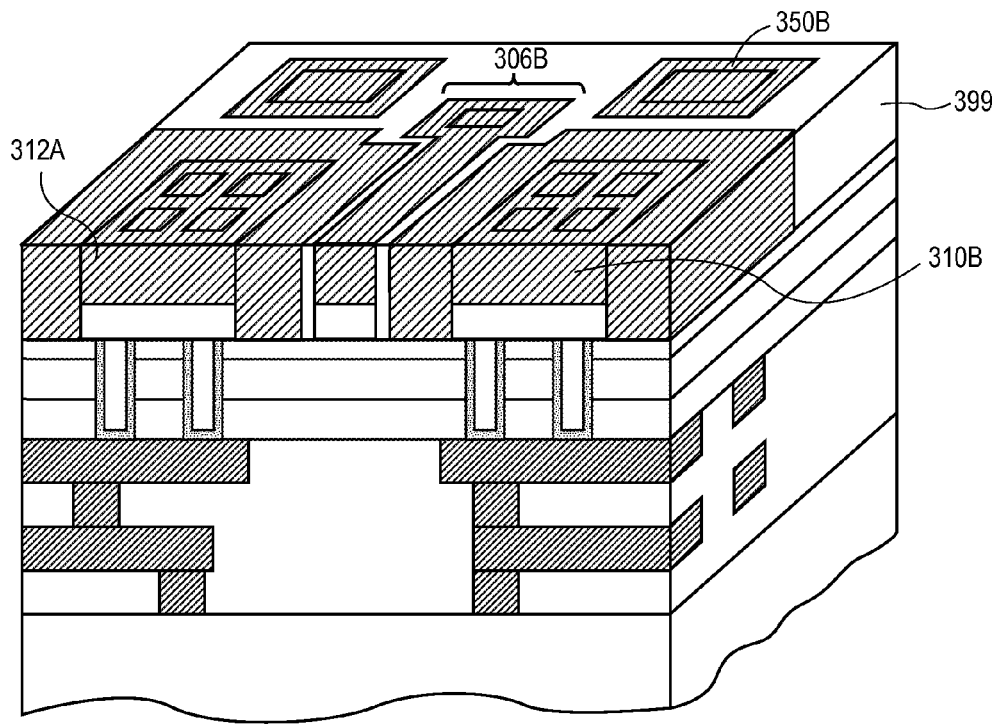
Figure 3R:
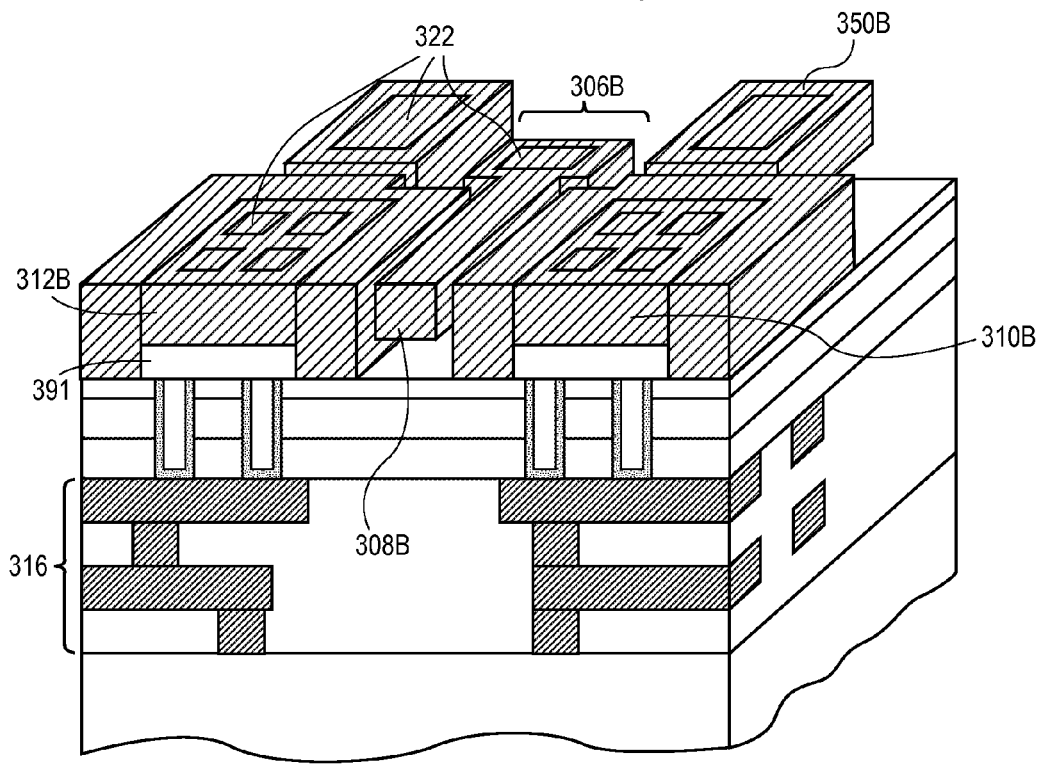

Referring to FIG. 3Q, sacrificial polish layer 399 is etched-back to a depth sufficient to expose hard-mask layer 394. In one embodiment, sacrificial polish layer 399 is composed substantially of germanium and is etched-back with a dry etch process using gases such as $SF_6$ or the combination $Cl_2$, HBr, $O_2$ and $BCl_3$. Hard-mask layer 394 may then be planarized by any planarization step suitable to selectively remove hard-mask layer 394 without significantly damaging coupled member 306B, coupled electrodes with extensions 310B and 312B and coupled dummy structures 350B. In accordance with an embodiment of the present invention, hard-mask layer 394 is planarized with a chemical-mechanical process step. In one embodiment, sacrificial polish layer 399 prevents the intrusion of slurry residue during the removal of hard-mask layer 394. In an alternative embodiment, a sacrificial polish layer is not employed and hard-mask layer 394 is removed directly following the patterning of second structural layer 398, described in association with FIG. 3O.

Referring to FIG. 3R, sacrificial polish layer 399, sidewall release layer 397 and first release layer 390 are removed to form suspended portion 308B of coupled member 306B. Sacrificial polish layer 399, sidewall release layer 397 and first release layer 390 may be removed by any process suitable to provide high selectivity to coupled member 308B, coupled electrodes with extensions 310B and 312B, coupled dummy structures 350B and couplers 322. In accordance with an embodiment of the present invention, sacrificial polish layer 399, sidewall release layer 397 and first release layer 390 are all composed of different materials and are removed in three distinct process steps. In an alternative embodiment, sacrificial polish layer 399, sidewall release layer 397 and first release layer 390 are composed of substantially the same material and are removed in the same process step. For example, in one embodiment, coupled member 308B, coupled electrodes with extensions 310B and 312B, coupled dummy structures 350B and couplers 322 are all composed of silicon-germanium, while sacrificial polish layer 399, sidewall release layer 397 and first release layer 390 are composed substantially of germanium and are removed by an oxidizing etchant. In a specific embodiment, sacrificial polish layer 399, sidewall release layer 397 and first release layer 390 are composed of germanium with an atomic concentration of greater than approximately 98% germanium atoms and a wet etchant including an aqueous solution of $H_2O_2$ with a concentration approximately in the range of 25-35% by volume and a temperature approximately in the range of 80-95° C. is used. In an embodiment, sacrificial polish layer 399, sidewall release layer 397 and first release layer 390 are removed with a selectivity greater than 20:1 over coupled member 308B, coupled electrodes with extensions 310B and 312B, coupled dummy structures 350B and couplers 322.

It is to be understood that the patterning of second structural layer 398 may be chosen to provide any structural arrangement desired for the fabricated MEMS device. For example, in accordance with an embodiment of the present invention, second structural layer 398 is patterned to completely surround pre-coupled electrodes 310A and 312B and, hence, to protect couplers 322 of coupled electrodes with extensions 310B and 312B. Thus, in a specific embodiment, residual portions 391 of first release layer 390 are encapsulated and retained in the final MEMS device, as depicted in FIG. 3R. Other couplers, such as couplers 322 of dummy structures 350B may not require protection. Thus, in accordance with an embodiment of the present invention, those structures not electrically coupled with the plurality of interconnects 316 are not surrounded with a protective portion of structural material during the patterning of second structural layer 398. For such structures, portions of first release layer 390 are not retained, as is also depicted in FIG. 3R.

Figure 4:
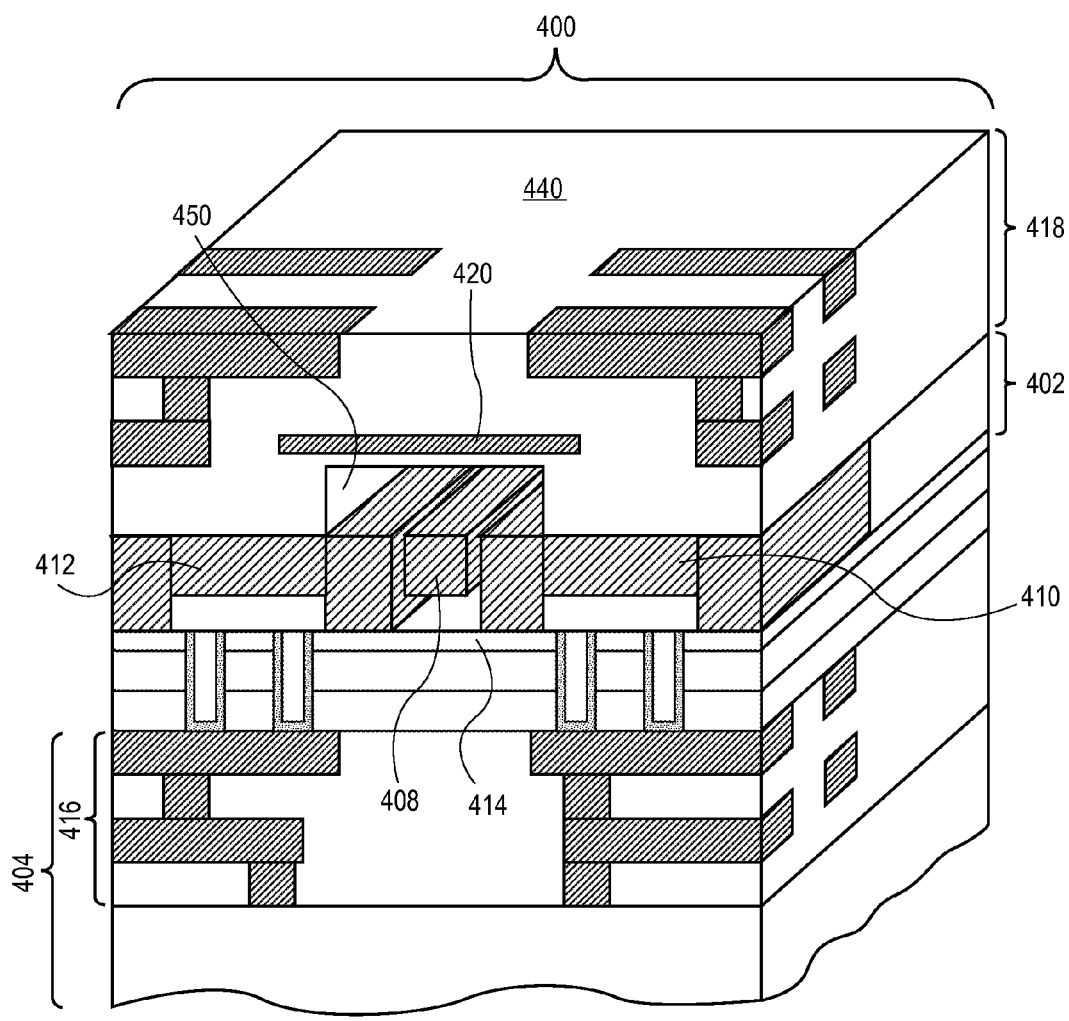
FIG. 4 illustrates a cross-sectional view representing an integrated circuit-compatible MEMS device in between two sets of interconnects, in accordance with an embodiment of the present invention.

In an aspect of the present invention, a MEMS device may be fabricated having a resonating member located between two pluralities of interconnects, one above the MEMS device and one below the MEMS device. FIG. 4 illustrates a cross-sectional view representing an integrated circuit-compatible MEMS device in between two sets of interconnects, in accordance with an embodiment of the present invention.

Referring to FIG. 4, a structure 400 includes a MEMS device 402 above a CMOS architecture 404. MEMS device 402 includes a member having a suspended portion 408 in between a driver electrode 410 and a sensor electrode 412 and suspended above an isolation layer 414. CMOS architecture 404 includes a first plurality of interconnects 416. In accordance with an embodiment of the present invention, the first plurality of interconnects 416 is fabricated prior to the fabrication of MEMS device 402. A second plurality of interconnects 418 is formed above MEMS device 402. In accordance with an embodiment of the present invention, the second plurality of interconnects 418 is fabricated after the fabrication of MEMS device 402. MEMS device 402 may be protected from the second plurality of interconnects 418 by a shield layer 420, as depicted in FIG. 4. Suspended portion 408 of MEMS device 402 is anchored to isolation layer 414 and is free from overlying dielectric layer 440. Thus, in accordance with an embodiment of the present invention, suspended portion 408 is housed in a cavity 450. In a specific embodiment, the pressure inside of cavity 450 is less than approximately 1 atm.

Figure 5:
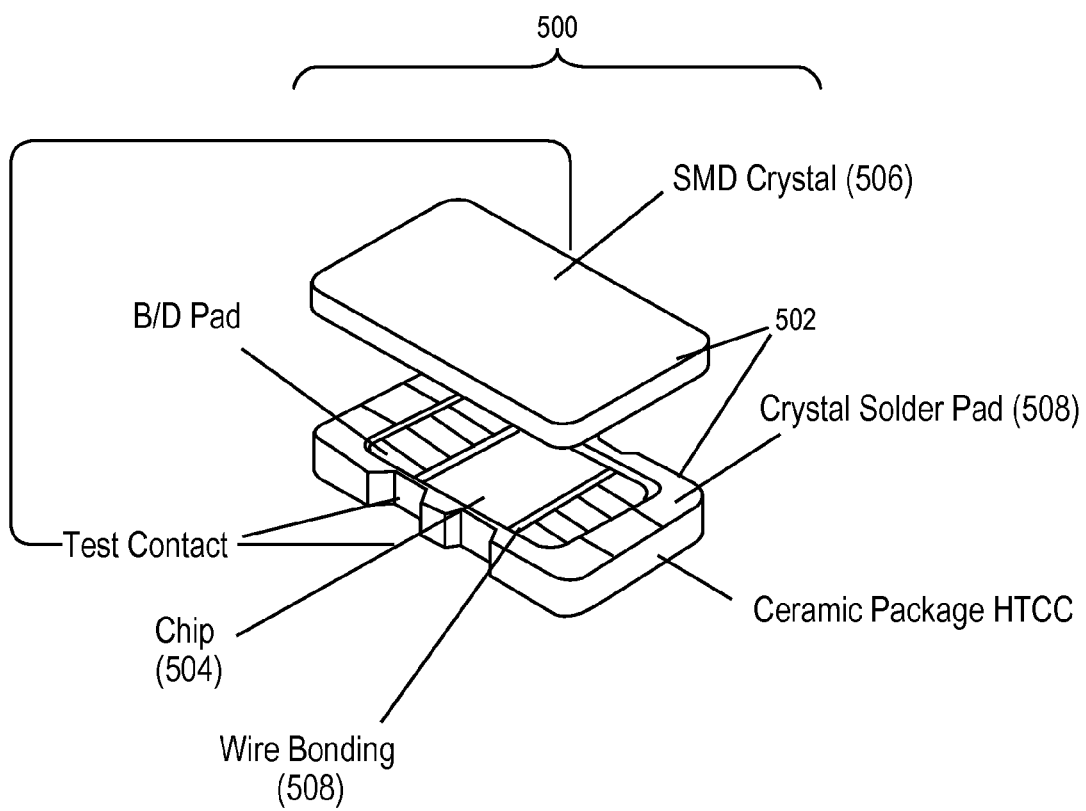
FIG. 5 illustrates a package housing both a crystal oscillator and a MEMS device, in accordance with an embodiment of the present invention.

In an aspect of the present invention, a hybrid system may include a crystal and an integrated circuit housed in a single package. FIG. 5 illustrates a package housing both a crystal oscillator and an integrated circuit including a MEMS device, in accordance with an embodiment of the present invention.

Referring to FIG. 5, a hybrid system 500 is housed in a single package 502 and includes a chip 504 and a surface-mounted crystal 506 (crystal not shown—it is disposed on the underside of the top portion of package 502). In accordance with an embodiment of the present invention, package 502 is composed of a high-temperature co-fired ceramic (HTTC) material. Crystal solder pads 508 are included for mechanically and electrically coupling solder terminals of electronic devices of crystal 506 and chip 504 (via wire bonding 508) to package 502. In one embodiment, the solder terminals of electronic devices of chip 504 are coupled to package 502 via wire bonding 508, as depicted in FIG. 5. In an alternative embodiment, chip 504 is flip-chip bonded to a flexible substrate and the solder terminals of electronic devices of chip 504 are coupled to package 502 via the flexible substrate. A bond pad (B/D pad) to interconnect chip 504 with package 502 and a test contact (test contact) to input and output test signals to and from chip 504 may also be included, as depicted in FIG. 5.

Chip 502 may be packaged below surface-mounted crystal 506, as depicted in FIG. 5, and may include a substrate. In accordance with an embodiment of the present invention, chip 502 includes and an integrated circuit which includes a plurality of devices formed in a semiconductor layer disposed above the substrate and a MEMS device disposed between the substrate and surface-mounted crystal 506. In one embodiment, a MEMS control circuit for the MEMS device and a crystal control circuit for surface-mounted crystal 506 are formed in the plurality of semiconductor devices on chip 502. In a specific embodiment, the MEMS device is disposed between the semiconductor layer and surface-mounted crystal 506. In another specific embodiment, the MEMS device is disposed between the substrate and the semiconductor layer. In an alternative embodiment, a crystal is included in the same package as a chip and is adjacent to the substrate of the chip.

Figure 6:
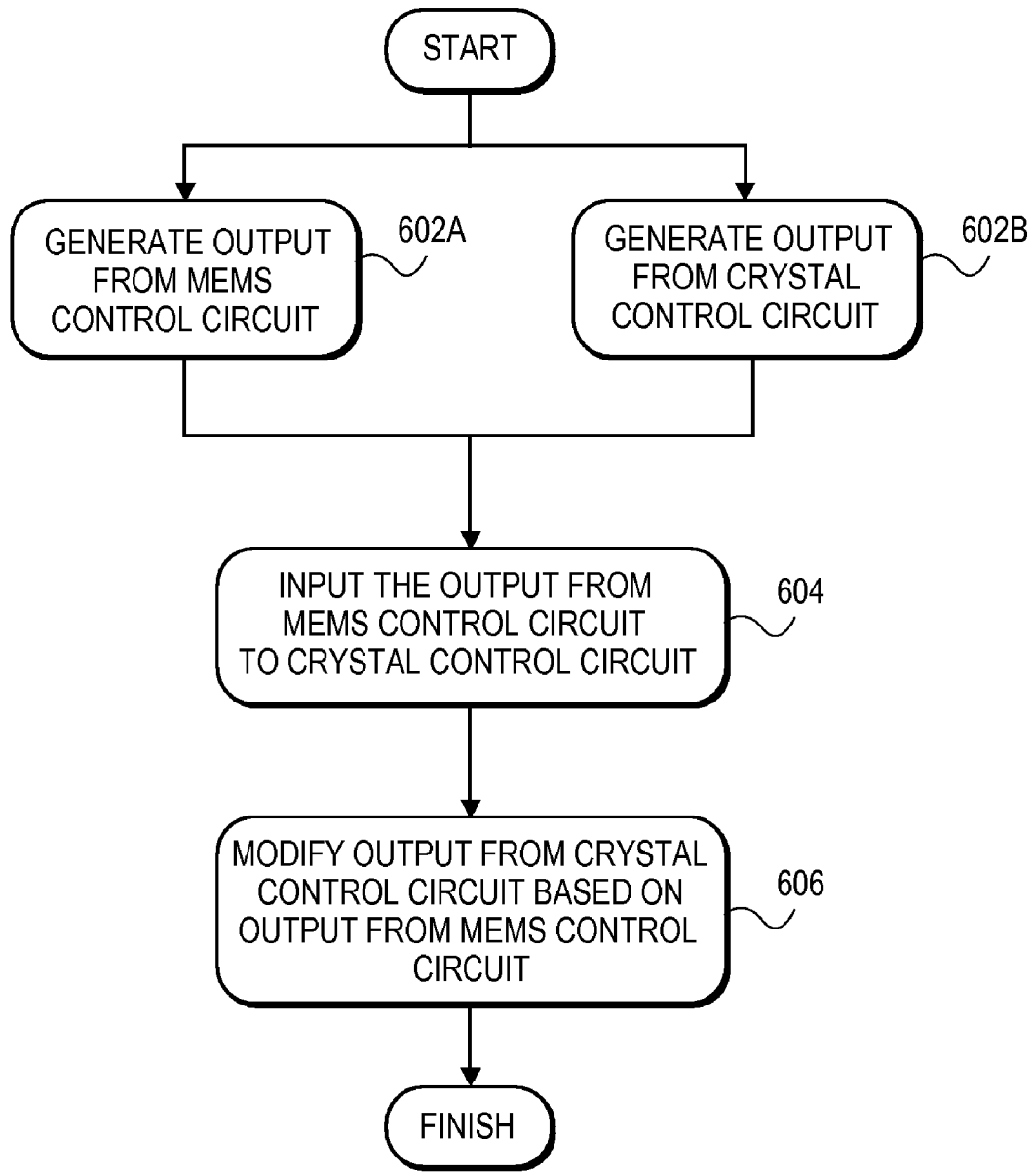
FIG. 6 is a flowchart representing steps used in a method to compensate the output of a crystal oscillator.

In an aspect of the present invention, a MEMS device from a hybrid system having a non-MEMS device and a MEMS device may be used to compensate the output of a crystal oscillator. FIG. 6 is a flowchart 600 representing steps used in a method to compensate the output of a crystal oscillator.

Referring to step 602A of FIG. 6, an output is generated from a MEMS control circuit. Referring to step 602B of FIG. 6, an output is generated from a crystal control circuit. In accordance with an embodiment of the present invention, the crystal control circuit is coupled to the MEMS control circuit. In one embodiment, the output of the MEMS control circuit is generated at approximately the same time as the output of the crystal control circuit. In another embodiment, the output of the MEMS control circuit is generated before the output of the crystal control circuit. In another embodiment, the output of the MEMS control circuit is generated after the output of the crystal control circuit.

Referring to step 604 of FIG. 6, the output from the MEMS control circuit is input to the crystal control circuit. Then, referring to step 606 of FIG. 6, the output from the crystal control circuit is modified or altered based on the output from the MEMS control circuit. In one embodiment, the MEMS control circuit is a MEMS oscillator circuit and the output from the MEMS control circuit is an oscillation output. In another embodiment, the MEMS control circuit is a MEMS temperature sensor circuit and the output from the MEMS control circuit is a temperature output. In another embodiment, the MEMS control circuit is a MEMS pressure sensor circuit and the output from the MEMS control circuit is a pressure output. In another embodiment, the MEMS control circuit is a MEMS inertial sensor circuit and the output from the MEMS control circuit is an inertial output.

Figure 7:
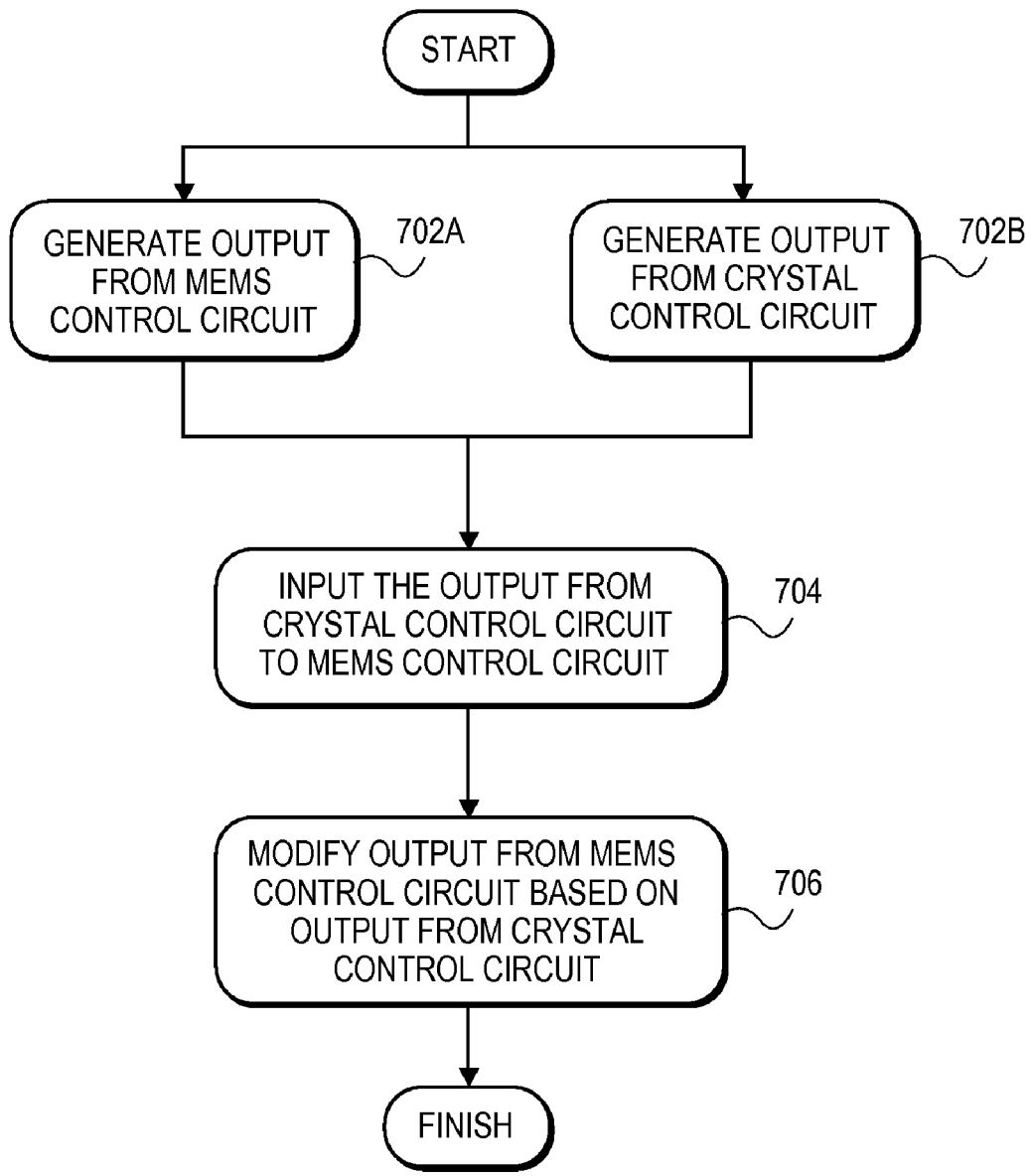
FIG. 7 is a flowchart representing steps used in a method to compensate the output of a MEMS device.

Alternatively, a crystal oscillator from a hybrid system may be used to compensate the output of a MEMS device. FIG. 7 is a flowchart 700 representing steps used in a method to compensate the output of a MEMS device.

Referring to step 702A of FIG. 7, an output is generated from a MEMS control circuit. Referring to step 702B of FIG. 7, an output is generated from a crystal control circuit. In accordance with an embodiment of the present invention, the crystal control circuit is coupled to the MEMS control circuit. In one embodiment, the output of the MEMS control circuit is generated at approximately the same time as the output of the crystal control circuit. In another embodiment, the output of the MEMS control circuit is generated before the output of the crystal control circuit. In another embodiment, the output of the MEMS control circuit is generated after the output of the crystal control circuit.

Referring to step 704 of FIG. 7, the output from the crystal control circuit is input to the MEMS control circuit. Then, referring to step 706 of FIG. 7, the output from the MEMS control circuit is modified or altered based on the output from the crystal control circuit. In one embodiment, the MEMS control circuit is a MEMS oscillator circuit. In another embodiment, the MEMS control circuit is a MEMS temperature sensor circuit. In another embodiment, the MEMS control circuit is a MEMS pressure sensor circuit. In another embodiment, the MEMS control circuit is a MEMS inertial sensor circuit.

It should be appreciated that the non-MEMS device of a hybrid system is not limited to a crystal. The non-MEMS device and MEMS device may be any technology pairing wherein each device is capable of producing a function. For example, the non-MEMS device may be a conventional technology for producing a certain function and the MEMS device may be a CMOS-compatible technology for producing the same or a different function. Thus, in accordance with an embodiment of the present invention, the term "hybrid" is used to mean two different technologies for achieving the same function, such as oscillation, temperature sensing, pressure sensing and inertial sensing. For example, in one embodiment, a hybrid system includes a crystal and a MEMS oscillator, both of which are provided for oscillation. In another embodiment, a hybrid system includes a thermistor and a MEMS temperature sensor, both of which are provided for temperature sensing. In another embodiment, a hybrid system includes an accelerometer and a MEMS inertial sensor, both of which are provided for inertial sensing. In one embodiment, the non-MEMS device of a hybrid system is a device such as, but not limited to, a crystal, a thermistor, an accelerometer or a chemical sensor. In one embodiment, the MEMS device is a device such as, but not limited to, a MEMS resonator, a MEMS temperature sensor, a MEMS inertial sensor, a MEMS pressure sensor or a MEMS switch. In a specific embodiment, the MEMS device is a MEMS resonator and is coupled to a MEMS frequency circuit. In a particular embodiment, the MEMS frequency circuit is a MEMS oscillator circuit. In another specific embodiment, the MEMS device is a MEMS inertial sensor such as, but not limited to, a MEMS accelerometer or a MEMS gyroscope.

Figure 8A:
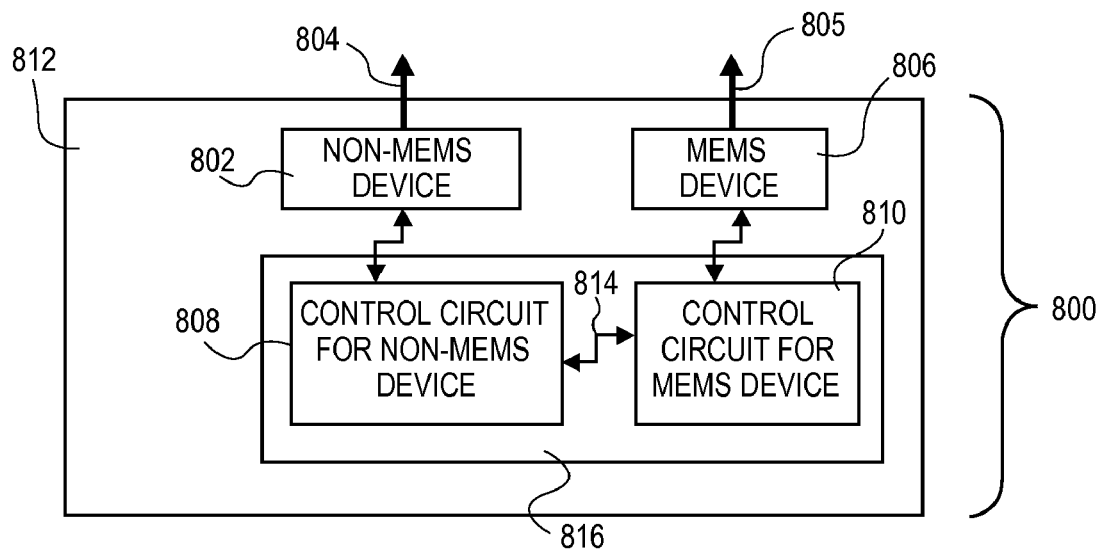
FIGS. 8A and 8B illustrate layouts for an apparatus having a non-MEMS device and a MEMS device, both of which produce outputs having the same function, in accordance with an embodiment of the present invention.
Figure 8B:
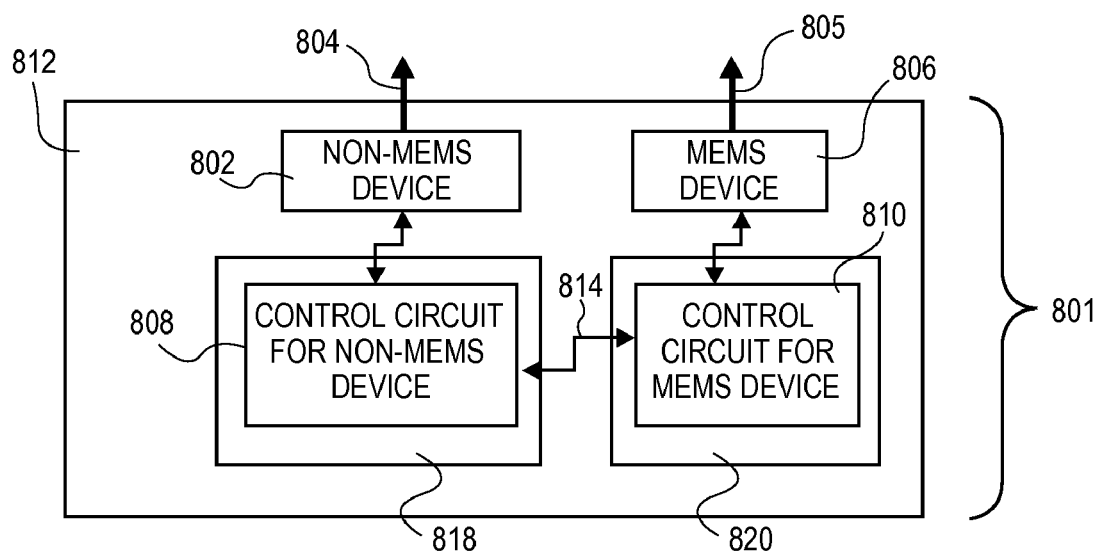

The function produced by the non-MEMS device of a hybrid system may be the same as the function produced as the MEMS device. FIGS. 8A and 8B illustrate layouts for an apparatus having a non-MEMS device and a MEMS device, both of which produce outputs having the same function, in accordance with an embodiment of the present invention.

Referring to FIGS. 8A and 8B, apparatuses 800 and 801, respectively, each include a non-MEMS device 802 for producing a first output 804 having a function, a MEMS device 806 for producing a second output 805 having the same function, a control circuit 808 for non-MEMS device 802 and a MEMS control circuit 810 for MEMS device 806. In accordance with an embodiment of the present invention, MEMS device 802, MEMS device 806, control circuit 808 and MEMS control circuit 810 are all housed in the same package 812, as depicted in FIGS. 8A and 8B. In one embodiment, control circuit 808 is coupled to MEMS control circuit 810 by a coupler 814, as is also depicted in FIGS. 8A and 8B. In a specific embodiment, control circuit 808 for non-MEMS device 802 and MEMS control circuit 810 for MEMS device 806 are disposed on the same substrate 816, as depicted in FIG. 8A. In a particular embodiment, MEMS device 806 is disposed on or above substrate 816. In an alternative specific embodiment, control circuit 808 for non-MEMS device 802 is disposed on a first substrate 818 and MEMS control circuit 810 for MEMS device 806 is disposed on a second substrate 820, as depicted in FIG. 8B. In a particular embodiment, MEMS device 806 is disposed on or above second substrate 820. In an embodiment, non-MEMS device 802 is a device such as, but not limited to, a crystal, a thermistor, an accelerometer or a chemical sensor and MEMS device 806 is a device such as, but not limited to, a MEMS resonator, a MEMS temperature sensor, a MEMS inertial sensor, a MEMS pressure sensor or a MEMS switch.

First output 804 and second output 805 may have a function achievable by both a MEMS device and a non-MEMS device. In accordance with an embodiment of the present invention, first output 804 and second output 805 have a function such as, but limited to, oscillation, temperature sensing, pressure sensing or inertial sensing. In one embodiment, first output 804 is for compensating second output 805. In an alternative embodiment, second output 805 is for compensating first output 804.

Figure 9:
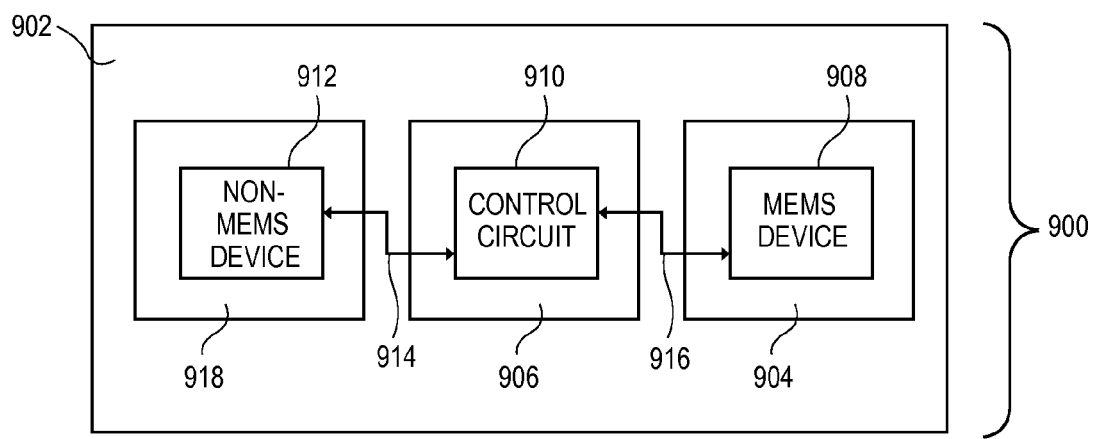
FIG. 9 illustrates a layout for an apparatus having a non-MEMS device and a MEMS device, wherein a control circuit for the non-MEMS device is included on a substrate separate from the substrate of the MEMS device, in accordance with an embodiment of the present invention.

It should be appreciated that, in a hybrid system, the control circuit for a MEMS device need not be included on the same substrate as the MEMS device. For example, a single package may include a MEMS device on a first substrate, a non-MEMS device on a second substrate, and an integrated circuit on a third substrate. The integrated circuit may include both a MEMS control circuit for the MEMS device and a control circuit for the non-MEMS device. Thus, in one embodiment, a hybrid system includes a multi-chip single-package arrangement. FIG. 9 illustrates a layout for an apparatus having a non-MEMS device and a MEMS device, wherein a control circuit for the non-MEMS device is included on a substrate separate from the substrate of the MEMS device, in accordance with an embodiment of the present invention.

Referring to FIG. 9, a hybrid system 900 includes a single package 902. A MEMS device 908 is disposed above a first substrate 904 housed in package 902. A second substrate 906 is also housed in package 902 and includes an integrated circuit 910 disposed thereon. Integrated circuit 910 is coupled to MEMS device 908 by a first coupler 916. A non-MEMS device 912 is also housed in package 902 and is coupled to integrated circuit 910 by a second coupler 914. In accordance with an embodiment of the present invention, integrated circuit 910 includes both a MEMS control circuit for MEMS device 908 and a control circuit for non-MEMS device 912. In one embodiment, the control circuit for non-MEMS device 912 is coupled to the MEMS control circuit for MEMS device 908. In an embodiment, non-MEMS device 912 is a crystal. In another embodiment, non-MEMS device 912 is a device such as, but not limited to, a thermistor, an accelerometer or a chemical sensor, and is disposed on a third substrate 918 housed in package 902, as depicted in FIG. 9.

Couplers 914 and 916 may be any suitable channel through which electrical signals may travel between non-MEMS device 912 and integrated circuit 910 and between integrated circuit 910 and MEMS device 908, respectively. For example, in one embodiment, couplers 914 and 916 include wire bonding. In another embodiment, first substrate 904, second substrate 906 and non-MEMS device 912 are all attached to a flexible substrate adhered to a surface of package 902 and having electrical traces disposed therein.

In an embodiment, MEMS device 908 is a device such as, but not limited to, a MEMS resonator, a MEMS temperature sensor, a MEMS inertial sensor, a MEMS pressure sensor, or a MEMS switch. In one embodiment, the MEMS control circuit includes a MEMS oscillator circuit for generating an oscillation output. In one embodiment, the MEMS control circuit includes a MEMS temperature sensor circuit for generating a temperature output. In one embodiment, the MEMS control circuit includes a MEMS pressure sensor circuit for generating a pressure output. In one embodiment, the MEMS control circuit includes a MEMS inertial sensor circuit for generating an inertial output. In a specific embodiment, MEMS device 908 is included for detecting an environmental change. In a particular embodiment, the MEMS control circuit is included for outputting an output into the control circuit for non-MEMS device 912. In an embodiment, the control circuit for non-MEMS device 912 is included for outputting an output into the MEMS control circuit.

Thus, a hybrid system having a non-MEMS device and a MEMS device has been disclosed. In accordance with an embodiment of the present invention, the apparatus includes a non-MEMS device and an integrated circuit including a MEMS device, the integrated circuit formed on a substrate. In one embodiment, the integrated circuit includes a control circuit for the non-MEMS device and a MEMS control circuit for the MEMS device.

What is claimed is:

1. An apparatus, comprising:
   a package;
   a substrate housed in said package;
   a crystal housed in said package; and
   an integrated circuit comprising:
      a plurality of devices formed in a semiconductor layer disposed above said substrate;
      a MEMS device disposed above said substrate;
      a MEMS control circuit, formed in a first portion of said plurality of semiconductor devices, for said MEMS device; and
      a crystal control circuit formed in a second portion of said plurality of semiconductor devices, wherein said crystal is above said substrate, and wherein said MEMS device is disposed between said semiconductor layer and said crystal.

2. An apparatus, comprising:
   a package;
   a substrate housed in said package;
   a crystal housed in said package; and
   an integrated circuit comprising:
      a plurality of devices formed in a semiconductor layer disposed above said substrate;
      a MEMS device disposed above said substrate;
      a MEMS control circuit, formed in a first portion of said plurality of semiconductor devices, for said MEMS device; and
      a crystal control circuit formed in a second portion of said plurality of semiconductor devices, wherein said crystal is above said substrate, and wherein said MEMS device is disposed between said substrate and said semiconductor layer.

3. The apparatus of claim 1, wherein said MEMS device is selected from the group consisting of a MEMS resonator, a MEMS temperature sensor, a MEMS inertial sensor, a MEMS pressure sensor, and a MEMS switch.

4. The apparatus of claim 3, wherein said MEMS device is a MEMS resonator, and wherein said MEMS control circuit is a MEMS frequency circuit.

5. The apparatus of claim 4, wherein said MEMS frequency circuit is a MEMS oscillator circuit.

6. The apparatus of claim 3, wherein said MEMS device is a MEMS inertial sensor, and wherein said MEMS inertial sensor is selected from the group consisting of a MEMS accelerometer and a MEMS gyroscope.

7. The apparatus of claim 1, wherein said MEMS control circuit comprises a MEMS oscillator circuit for generating an oscillation output.

8. The apparatus of claim 1, wherein said MEMS control circuit comprises a MEMS temperature sensor circuit for generating a temperature output.

9. The apparatus of claim 1, wherein said MEMS control circuit comprises a MEMS pressure sensor circuit for generating a pressure output.

10. The apparatus of claim 1, wherein said MEMS control circuit comprises a MEMS inertial sensor circuit for generating an inertial output.

11. The apparatus of claim 1, wherein said MEMS control circuit comprises a MEMS temperature sensor circuit for generating a temperature output, said integrated circuit further comprising:
    a MEMS oscillator circuit for generating an oscillation output.

12. The apparatus of claim 1, wherein said MEMS device is for detecting an environmental change.

13. The apparatus of claim 1, wherein said MEMS control circuit is coupled to said crystal control circuit.

14. The apparatus of claim 13, wherein said crystal control circuit is a crystal oscillator circuit, and wherein said MEMS control circuit comprises a MEMS oscillator circuit for outputting an oscillation output into said crystal oscillator circuit.

15. The apparatus of claim 13, wherein said crystal control circuit is a crystal oscillator circuit, and wherein said MEMS control circuit comprises a MEMS temperature sensor circuit for outputting a temperature output into said crystal oscillator circuit.

16. The apparatus of claim 13, wherein said crystal control circuit is a crystal oscillator circuit, and wherein said MEMS control circuit comprises a MEMS pressure sensor circuit for outputting a pressure output into said crystal oscillator circuit.

17. The apparatus of claim 13, wherein said crystal control circuit is a crystal oscillator circuit, and wherein said MEMS control circuit comprises a MEMS inertial sensor circuit for outputting an inertial output into said crystal oscillator circuit.

18. The apparatus of claim 15, wherein said integrated circuit further comprises:
a MEMS oscillator circuit for generating an oscillation output.

19. The apparatus of claim 13, wherein said crystal control circuit is a crystal oscillator circuit for outputting a crystal oscillation output into said MEMS control circuit.

20. The apparatus of claim 1, wherein said crystal and said integrated circuit are housed together in a single package.

21. The apparatus of claim 1, wherein said crystal comprises a material selected from the group consisting of quartz and a ceramic material.

22. The apparatus of claim 1, wherein said MEMS device is for detecting an environmental change.

23. The apparatus of claim 1, wherein said MEMS control circuit is coupled to said crystal control circuit.

24. The apparatus of claim 23, wherein said crystal control circuit is a crystal oscillation circuit for outputting a crystal oscillation output into said MEMS control circuit.

25. The apparatus of claim 1, wherein said crystal comprises a material selected from the group consisting of quartz and a ceramic material.

26. The apparatus of claim 2, wherein said MEMS device is selected from the group consisting of a MEMS resonator, a MEMS temperature sensor, a MEMS inertial sensor, a MEMS pressure sensor, and a MEMS switch.

27. The apparatus of claim 1, wherein said crystal is for producing a first output having a function; wherein said MEMS device is for producing an second output having said function; and wherein said first output is for compensating said second output.

28. The apparatus of claim 1, wherein said crystal is for producing a first output having a function; wherein said MEMS device is for producing an second output having said function; and wherein said second output is for compensating said first output.

29. The apparatus of claim 2, wherein said MEMS device is for detecting an environmental change.

30. The apparatus of claim 2, wherein said MEMS control circuit is coupled to said crystal control circuit.

31. The apparatus of claim 30, wherein said crystal control circuit is a crystal oscillation circuit for outputting a crystal oscillation output into said MEMS control circuit.

32. The apparatus of claim 2, wherein said crystal comprises a material selected from the group consisting of quartz and a ceramic material.

33. The apparatus of claim 2, wherein said MEMS device is selected from the group consisting of a MEMS resonator, a MEMS temperature sensor, a MEMS inertial sensor, a MEMS pressure sensor, and a MEMS switch.

34. The apparatus of claim 2, wherein said MEMS control circuit comprises a MEMS oscillator circuit for generating an oscillation output.

35. The apparatus of claim 2, wherein said MEMS control circuit comprises a MEMS temperature sensor circuit for generating a temperature output.

36. The apparatus of claim 2, wherein said MEMS control circuit comprises a MEMS pressure sensor circuit for generating a pressure output.

37. The apparatus of claim 2, wherein said MEMS control circuit comprises a MEMS inertial sensor circuit for generating an inertial output.

38. The apparatus of claim 2, wherein said MEMS control circuit comprises a MEMS temperature sensor circuit for generating a temperature output, said integrated circuit further comprising:
a MEMS oscillator circuit for generating an oscillation output.

39. The apparatus of claim 2, wherein said MEMS device is for detecting an environmental change.

40. The apparatus of claim 2, wherein said MEMS control circuit is coupled to said crystal control circuit.

41. The apparatus of claim 2, wherein said crystal and said integrated circuit are housed together in a single package.

42. The apparatus of claim 2, wherein said crystal is for producing a first output having a function; wherein said MEMS device is for producing an second output having said function; and wherein said first output is for compensating said second output.

43. The apparatus of claim 2, wherein said crystal is for producing a first output having a function; wherein said MEMS device is for producing an second output having said function; and wherein said second output is for compensating said first output.

44. A method for MEMS output compensation, comprising:
generating an output from a MEMS control circuit;
generating an output from a crystal control circuit, wherein said crystal control circuit is coupled to said MEMS control circuit;
inputting said output from said crystal control circuit to said MEMS control circuit; and
modifying said output from said MEMS control circuit based on said output from said crystal control circuit.

45. The method of claim 44, wherein said MEMS control circuit is a MEMS oscillator circuit.

46. The method of claim 44, wherein said MEMS control circuit is a MEMS temperature sensor circuit.

47. The method of claim 44, wherein said MEMS control circuit is a MEMS pressure sensor circuit.

48. The method of claim 44, wherein said MEMS control circuit is a MEMS inertial sensor circuit.

* * * * *